(12) United States Patent
Tzafrir

(10) Patent No.: US 10,635,131 B2
(45) Date of Patent: Apr. 28, 2020

(54) INTERFACE ADJUSTMENT PROCESSES FOR A DATA STORAGE DEVICE

(71) Applicant: SANDISK TECHNOLOGIES LLC, Addison, TX (US)

(72) Inventor: Yonatan Tzafrir, Petah Tikva (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/160,496

(22) Filed: Oct. 15, 2018

(65) Prior Publication Data

US 2019/0050022 A1 Feb. 14, 2019

Related U.S. Application Data

(62) Division of application No. 14/812,794, filed on Jul. 29, 2015, now Pat. No. 10,101,763.

(51) Int. Cl.

| G06F 1/12 | (2006.01) |
| G06F 1/04 | (2006.01) |
| G06F 13/16 | (2006.01) |
| G06F 13/42 | (2006.01) |
| H03M 13/05 | (2006.01) |
| G11C 29/02 | (2006.01) |

(52) U.S. Cl.
CPC ............... *G06F 1/12* (2013.01); *G06F 1/04* (2013.01); *G06F 13/1668* (2013.01); *G06F 13/1694* (2013.01); *G06F 13/4282* (2013.01); *G11C 29/022* (2013.01); *G11C 29/023* (2013.01); *G11C 29/028* (2013.01); *H03M 13/05* (2013.01); *G11C 2207/2254* (2013.01)

(58) Field of Classification Search
CPC ........... G06F 1/12; G06F 1/04; G06F 13/1668
See application file for complete search history.

(56) References Cited

U.S. PATENT DOCUMENTS

| 5,594,681 A | * | 1/1997 | Taguchi | ............... | G11C 7/1006 |
| | | | | | 365/149 |
| 6,424,688 B1 | * | 7/2002 | Tan | ........................... | G06F 1/12 |
| | | | | | 375/354 |
| 6,757,304 B1 | * | 6/2004 | Nomura | .................... | H03L 7/18 |
| | | | | | 370/516 |

(Continued)

OTHER PUBLICATIONS

Arasan Chip Systems, Inc.,"Arasan Chip Systems Introduces First eMMC v5.0 I/O PADs & PHY IP using TSMC 28nmHPM Process", http://arasan.com; Oct. 28, 2013 (4 pages).

(Continued)

*Primary Examiner* — Joseph D Torres
(74) *Attorney, Agent, or Firm* — Patterson & Sheridan, LLP; Steven Versteeg

(57) ABSTRACT

A data storage device includes a controller and a memory die. The controller includes a host interface and a memory interface. A method includes receiving a message from a host device via the host interface. The message indicates that the host device is to perform a first adjustment process associated with the host interface. The method further includes performing a second adjustment process associated with the memory interface in response to receiving the message indicating that the host device is to perform the first adjustment process.

13 Claims, 12 Drawing Sheets

(56) References Cited

U.S. PATENT DOCUMENTS

| | | | | |
|---|---|---|---|---|
| 6,792,554 | B2* | 9/2004 | Gervais | G06F 1/10 |
| | | | | 713/401 |
| 7,966,468 | B1* | 6/2011 | Simeral | G06F 13/405 |
| | | | | 710/100 |
| 8,271,824 | B2 | 9/2012 | Kuroki | |
| 8,307,180 | B2* | 11/2012 | Hyvonen | G06F 13/1694 |
| | | | | 711/163 |
| 8,589,717 | B1* | 11/2013 | Davis | G06F 1/04 |
| | | | | 713/500 |
| 2002/0147882 | A1* | 10/2002 | Pua | G06F 3/0607 |
| | | | | 711/103 |
| 2004/0044919 | A1* | 3/2004 | Dabral | H04L 7/0012 |
| | | | | 713/400 |
| 2004/0049708 | A1* | 3/2004 | Thomas, Jr. | G06F 1/12 |
| | | | | 713/500 |
| 2005/0091425 | A1* | 4/2005 | Wyatt | G06F 1/3203 |
| | | | | 710/33 |
| 2006/0112312 | A1* | 5/2006 | Dickenson | G06F 11/3636 |
| | | | | 714/28 |
| 2006/0236024 | A1* | 10/2006 | Saga | G06F 3/0625 |
| | | | | 711/100 |
| 2007/0100888 | A1* | 5/2007 | Kim | G06F 16/40 |
| 2007/0143532 | A1* | 6/2007 | Gorobets | G06F 3/0638 |
| | | | | 711/103 |
| 2007/0183553 | A1* | 8/2007 | Sanders | H03L 7/091 |
| | | | | 375/376 |
| 2008/0080654 | A1* | 4/2008 | Klowden | H04L 25/14 |
| | | | | 375/371 |
| 2010/0169699 | A1* | 7/2010 | Fujimoto | G06F 13/4291 |
| | | | | 713/503 |
| 2010/0274933 | A1* | 10/2010 | Wang | G06F 3/0625 |
| | | | | 710/22 |
| 2011/0093753 | A1* | 4/2011 | Takagi | G06F 11/1004 |
| | | | | 714/746 |
| 2011/0314226 | A1* | 12/2011 | Cho | G06F 12/0866 |
| | | | | 711/129 |

OTHER PUBLICATIONS

Arasan Chip Systems, Inc., "Tuning", https://arasan.com; Jan. 30, 2015 (3 pages).

Chung et al.: " Deseign Considerations of UFS and eMMC Controllers Compliance and Compatibility" Arasan Chip Systems, Inc,; DEDEC Mobile Forum, San Jose, May 2013 (17 pages).

* cited by examiner

INTERFACE ADJUSTMENT PROCESSES FOR A DATA STORAGE DEVICE

CROSS-REFERENCE TO RELATED APPLICATIONS

This application is a divisional of U.S. patent application Ser. No. 14/812,794, filed Jul. 29, 2015, and issued as U.S. Pat. No. 10,101,763 on Oct. 16, 2018, which is herein incorporated by reference.

FIELD OF THE DISCLOSURE

This disclosure is generally related to data storage devices and more particularly to interface adjustment processes for data storage devices.

BACKGROUND

Non-volatile storage devices have enabled increased portability of data and software applications. During operation of a storage device, data may be programmed to the storage device, read from the storage device, and erased from the storage device. For example, an accessing device (e.g., a host device) may send data and commands to the storage device using an interface.

Operation of the interface may be calibrated to improve performance. For example, impedance matching may be performed between a host device and a storage device to improve operation, such as by reducing signal attenuation and reflections at the interface.

In some cases, a timing signal used at the interface (e.g., a clock signal used in connection with a synchronous interface) may be poorly calibrated with respect to data sent using the interface. For example, if clock edges of the clock signal occur near bit transitions of the data, then a "wrong" bit of the data may be sampled, potentially resulting in errors and loss of data.

DETAILED DESCRIPTION

Figure 1A:
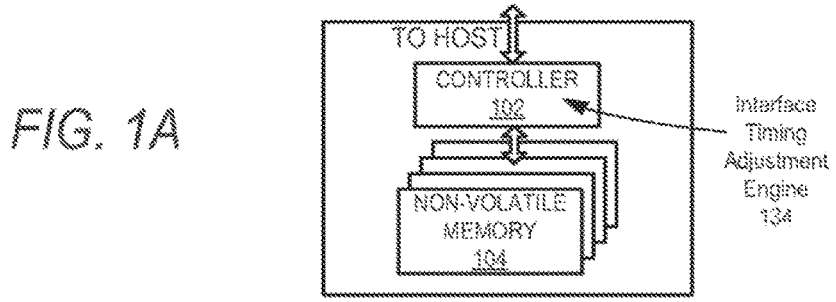
FIG. 1A is a block diagram of an illustrative example of a non-volatile memory system including a controller that includes an interface timing adjustment engine.

A data storage device includes a memory device and a controller. The controller is coupled to the memory device via a first interface (e.g., a memory interface) and is further coupled to an accessing device via a second interface. For example, the accessing device may correspond to a host device, and the second interface may correspond to a host interface. In response to the host device providing a message indicating that the host device is to initiate a first adjustment process associated with the host interface, the controller may initiate a second adjustment process associated with the memory interface. The second adjustment process may include using the memory interface for one or more memory access operations, such as read operations, write operations, or both. The first adjustment process may include adjusting a phase of a timing signal (e.g., a clock signal, a strobe signal, or a read enable signal) associated with the first interface, and the second adjustment process may include adjusting a phase of a timing signal associated with the second interface.

By performing one or more memory access operations using the memory interface in response to the host device initiating the first adjustment process, the adjustment processes may be performed under more "accurate" conditions (e.g., conditions that more closely correspond to operating conditions at the data storage device, such as operating conditions during read operations and write operations), which may improve operation of the memory interface and the host interface. For example, the one or more memory access operations may cause noise at the host interface. As another example, the one or more memory access operations may cause a voltage drop associated with a supply voltage that is provided to the data storage device and to the host device. Performing the adjustment processes concurrently (or at least partially concurrently) may enable a "worst case" condition for both the adjustment processes, improving accuracy of the adjustment processes.

The examples described herein may reduce or avoid certain interface signal integrity effects (e.g., "bottlenecks") that may cause failure of read operations (or write operations) due to poor read strobe-to-data timing (or write strobe-to-data timing). For example, an interface signal integrity "bottleneck" may occur at memories with relatively large read and write access frequencies and relatively large memory sizes, such as memories that include eight or more memory dies, as an illustrative example. Such an interface signal integrity effect may reduce device performance.

The signal integrity problem may be illustrated using an eye diagram. Eye diagrams may be used to illustrate signal transitions (e.g., from a logic "0" bit to a logic "1" bit, or vice versa) that are too long, too short, poorly synchronized with a timing signal, too high, too low, too noisy, or too slow to change, or have too much undershoot or overshoot. An "open" eye diagram (e.g., with greater margin between voltage states and faster rise and fall time) indicates less signal distortion as compared to a "closed" eye diagram (e.g., with less margin between states). Interface signal integrity in a memory may be represented by an eye diagram that depends on one or more parameters, such as a length of the lines or traces between devices, the particular fabrication process, the type of interface, an operating temperature, an interface or supply voltage level, a voltage of the memory, or the number of memory dies connected to the memory controller, as illustrative examples. In accordance with the disclosure, performing multiple interface adjustment processes concurrently may provide for a "worst case" scenario of such parameters. Adjusting an interface based on a "worst case" scenario may improve interface signal integrity by enabling a data storage device to operate in accordance with a greater range of operating conditions (and may avoid "closing" of an eye diagram that represents the interface signal integrity).

To further illustrate, programming and erase operations at a non-volatile memory may consume a large amount of power (e.g., by causing power consumption "peaks"). By programming or erasing storage elements at the non-volatile memory in response to a host device initiating an adjustment process, a power supply voltage may be temporarily reduced, thus temporarily decreasing voltage supplied to interface bus drivers (of either a memory interface or a host interface) and reducing interface signal integrity (e.g., resulting in a "closed" eye diagram) during interface adjustment, enabling more robust interface adjustment.

Particular aspects of the present disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation.

Figure 1B:
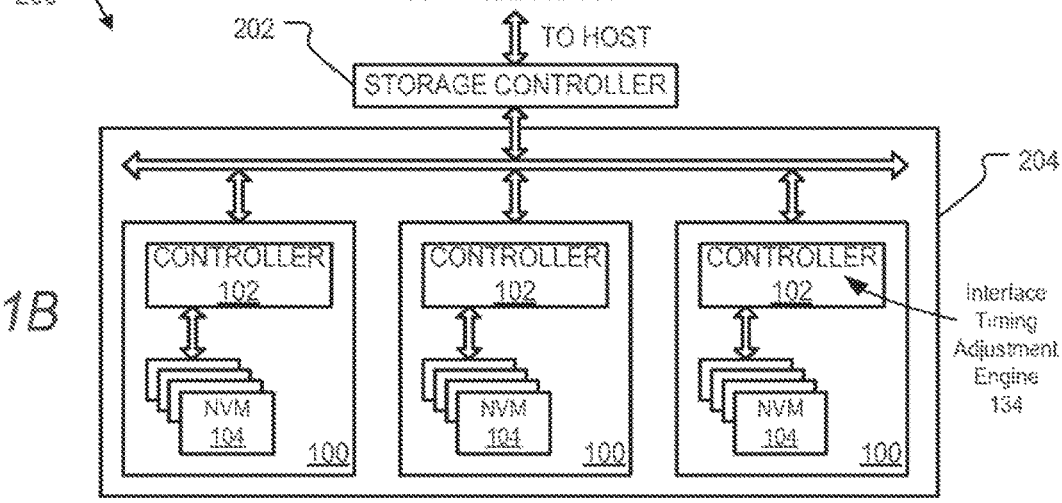
FIG. 1B is a block diagram of an illustrative example of a storage module that includes plural non-volatile memory systems that each may include a controller having an interface timing adjustment engine.
Figure 1C:
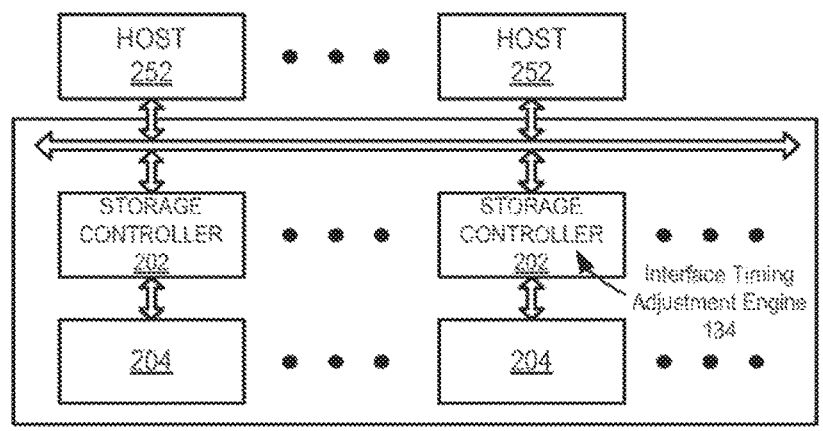
FIG. 1C is a block diagram of an illustrative example of a hierarchical storage system that includes a plurality of storage controllers that each may include an interface timing adjustment engine.

Memory systems suitable for use in implementing aspects of the disclosure are shown in FIGS. 1A-1C. FIG. 1A is a block diagram illustrating a non-volatile memory system according to an example of the subject matter described herein. Referring to FIG. 1A, a non-volatile memory system 100 includes a controller 102 and non-volatile memory that may be made up of one or more non-volatile memory die 104. As used herein, the term "memory die" refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The controller 102 may include an interface timing adjustment engine 134. An illustrative implementation of the interface timing adjustment engine 134 is described further with reference to FIG. 3A.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host is to read data from or write data to the flash memory, the host communicates with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, non-volatile memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller 102 and the non-volatile memory die 104, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers. Each controller 102 of FIG. 1B may include an interface timing adjustment engine corresponding to the interface timing adjustment engine 134. Alternatively or in addition, the storage controller 202 may include an interface timing adjustment engine corresponding to the interface timing adjustment engine 134.

FIG. 1C is a block diagram illustrating a hierarchical storage system. A hierarchical storage system 250 includes a plurality of storage controllers 202, each of which controls a respective storage system 204. Host systems 252 may access memories within the hierarchical storage system 250 via a bus interface. In one embodiment, the bus interface may be an NVMe or fiber channel over Ethernet (FCoE) interface. In one embodiment, the hierarchical storage system 250 illustrated in FIG. 1C may be a rack mountable mass storage system that is accessible by multiple host computers, such as would be found in a data center or other location where mass storage is needed. Each storage controller 202 of FIG. 1B may include an interface timing adjustment engine corresponding to the interface timing adjustment engine 134.

Figure 2A:
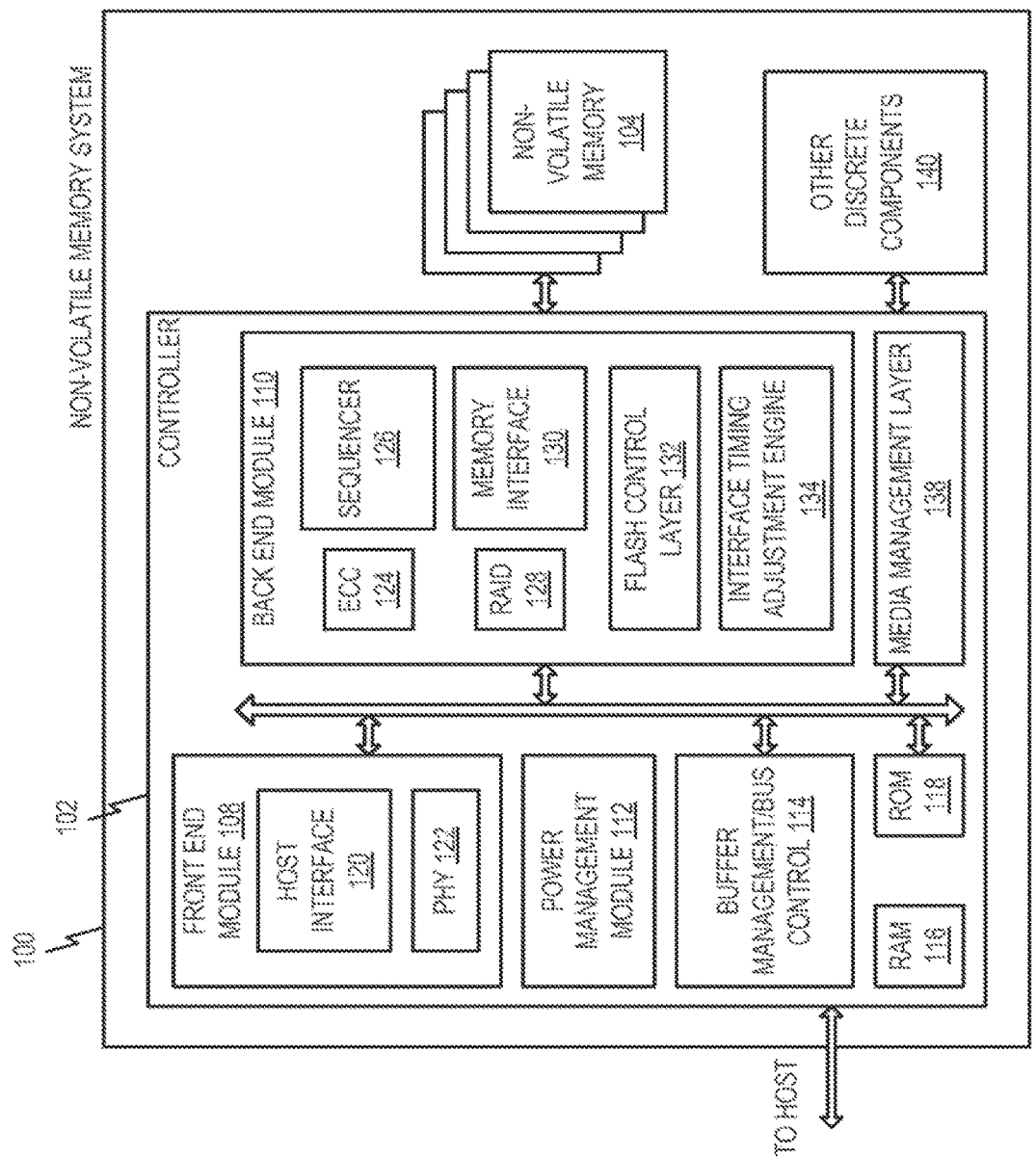
FIG. 2A is a block diagram illustrating an example of a non-volatile memory system including a controller that may include an interface timing adjustment engine.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 114 manages buffers in random access memory (RAM) 116 and controls the internal bus arbitration of the controller 102. A read only memory (ROM) 118 stores system boot code. Although illustrated in FIG. 2A as located within the controller 102, in other embodiments one or both of the RAM 116 and the ROM 118 may be located externally to the controller 102. In yet other embodiments, portions of RAM and ROM may be located both within the controller 102 and outside the controller 102.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction code (ECC) engine 124 that encodes the data received from the host, and decodes and error corrects the data read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory die 104. In some cases, the RAID module 128 may be a part of the ECC engine 124. A memory interface 130 provides the command sequences to non-volatile memory die 104 and receives status information from non-volatile memory die 104. For example, the memory interface 130 may be a double data rate (DDR) interface, such as a Toggle Mode 200, 400, or 800 interface. A flash control layer 132 controls the overall operation of back end module 110. The back end module 110 may also include the interface timing adjustment engine 134.

Additional components of system 100 illustrated in FIG. 2A include a power management module 112 and a media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are omitted from the controller 102.

Figure 2B:
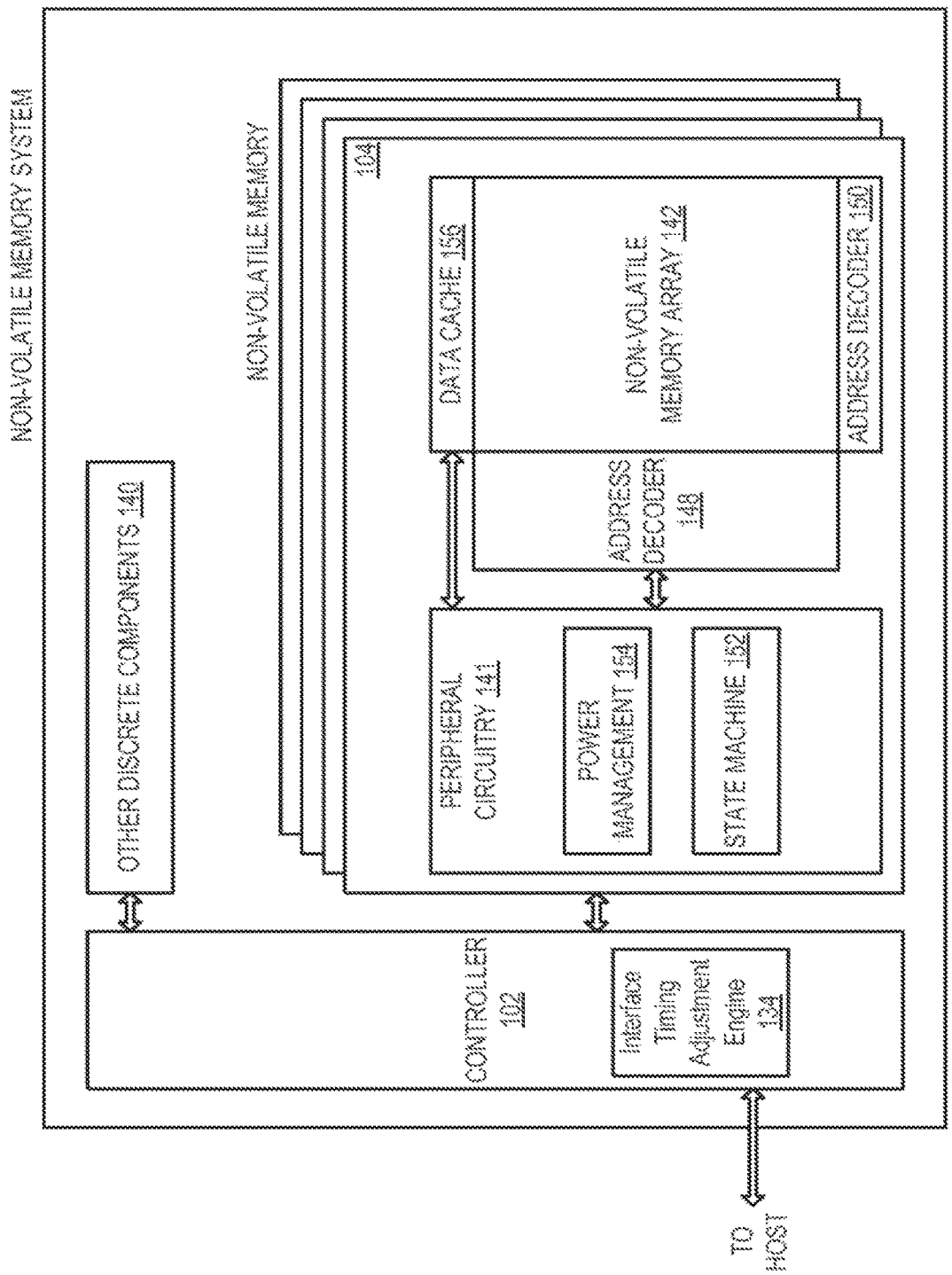
FIG. 2B is a block diagram illustrating exemplary components of a non-volatile memory die that may be coupled to a controller that includes an interface timing adjustment engine.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102, which may include the interface timing adjustment engine 134. The peripheral circuitry 141 may also include a power management or data latch control module 154. Non-volatile memory die 104 further includes discrete components 140, an address decoder 148, an address decoder 150, and a data cache 156 that caches data.

Figure 3A:
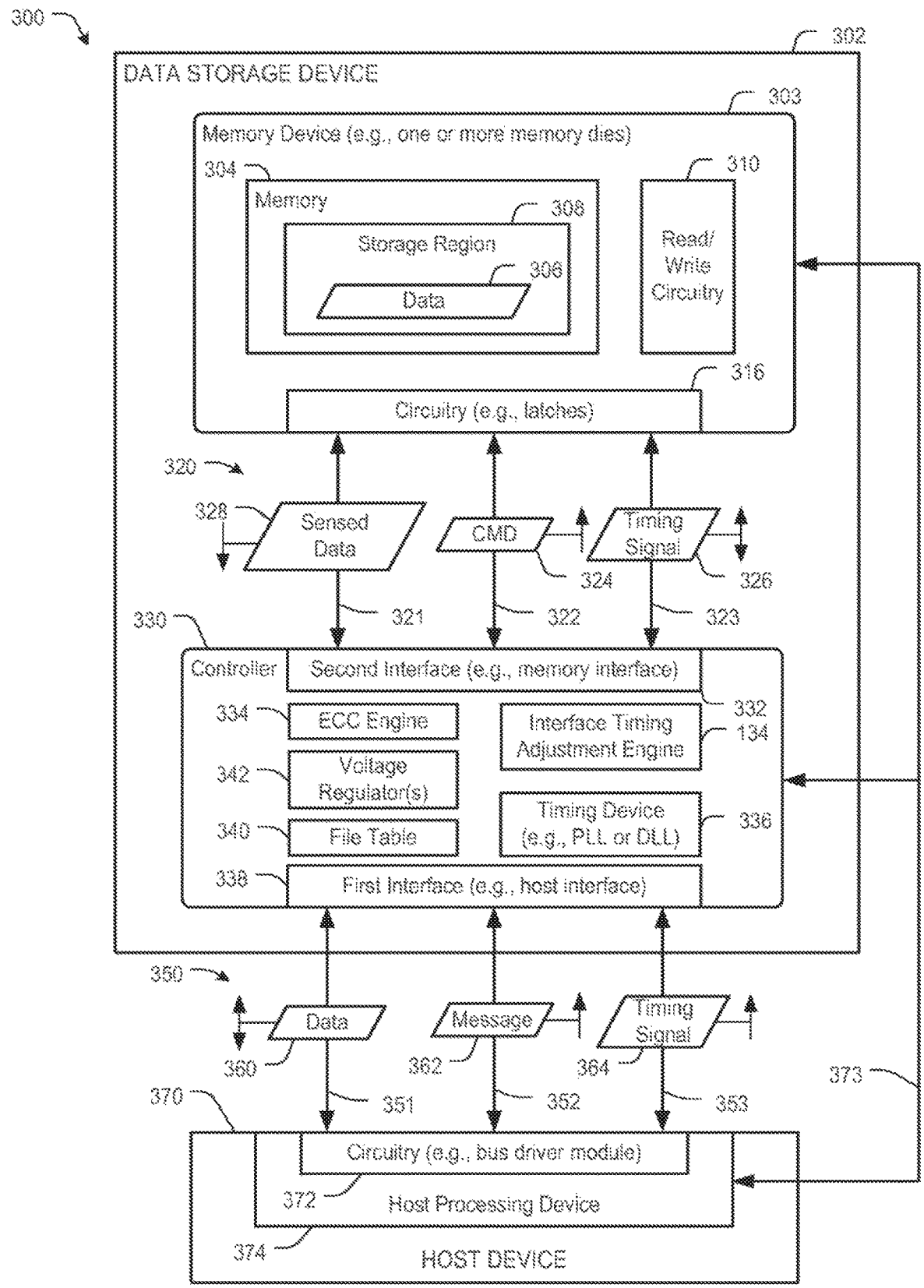
FIG. 3A is a block diagram of a particular illustrative example of a system including a data storage device that includes an interface timing adjustment engine.

FIG. 3A depicts an illustrative example of a system 300. The system 300 includes a data storage device 302 (e.g., the non-volatile memory system 100) and a host device 370 (e.g., the host 252).

The data storage device 302 may include a memory device, such as a memory device 303. The memory device 303 may include one or more memory dies (e.g., one memory die, two memory dies, eight memory dies, or another number of memory dies). To further illustrate, the memory device 303 may include the non-volatile memory die 104. The memory device 303 includes a memory 304, such as a non-volatile memory of storage elements included in a memory die of the memory device 303. For example, the memory 304 may include a flash memory, such as a NAND flash memory, or a resistive memory, such as a resistive random access memory (ReRAM), as illustrative examples. The memory 304 may have a three-dimensional (3D) memory configuration. As an example, the memory 304 may have a 3D vertical bit line (VBL) configuration. In a particular implementation, the memory 304 is a non-volatile memory having a 3D memory configuration that is monolithically formed in one or more physical levels of arrays of memory cells having an active area disposed above a silicon substrate. Alternatively, the memory 304 may have another configuration, such as a two-dimensional (2D) memory configuration or a non-monolithic 3D memory configuration (e.g., a stacked die 3D memory configuration).

The memory 304 may include one or more regions of storage elements (also referred to herein as memory cells), such as a storage region 308. An example of a storage region is a block, such as a NAND flash erase group of storage elements. Another example of a storage region is a word line of storage elements. A word line may function as a single-level-cell (SLC) word line or as a multi-level-cell (MLC) word line (such as a three-bit-per-cell word line or a two-bit-per-cell word line, as illustrative examples). Each storage element of the memory 304 may be programmable to a state (e.g., a threshold voltage in a flash configuration or a resistive state in a resistive memory configuration) that indicates one or more bit values.

The memory device 303 further includes read/write circuitry 310. The read/write circuitry 310 is configured to program values to storage elements of the memory 304 and to sense values from storage elements of the memory 304. The memory device 303 may further include circuitry 316 (e.g., one or more data latches, one or more control latches, or a combination thereof).

The data storage device 302 may further include a controller 330. The controller 330 may include a first interface 338 (e.g., a host interface), an error correction code (ECC) engine 334, a timing device 336, a second interface 332 (e.g., a memory interface), and one or more voltage regulators 342. For example, the ECC engine 334 may correspond to the ECC engine 124, the first interface 338 may correspond to the host interface 120, and the second interface 332 may correspond to the memory interface 130. To further illustrate, the first interface 338 may include one or more latches to receive data and commands from the host device 370, and the second interface 332 may include one or more bus drivers to send data and commands to the circuitry 316 of the memory device 303. The controller 330 may store (or access) a file table 340, such as a file allocation table (FAT). The controller 330 also includes the interface timing adjustment engine 134.

The host device 370 may include circuitry 372. For example, the circuitry 372 may include one or more bus drivers. The circuitry 372 may be integrated within or coupled to a processor or controller of the host device 370, such as within a host processing device 374 (e.g., an application processor).

The data storage device 302 and the host processing device 374 are coupled via a connection 350 (e.g., a bus). For example, FIG. 3A illustrates that the connection 350 may include one or more data lines 351, one or more control lines 352, and one or more timing signal lines 353. The connection 350 is coupled to the first interface 338 and to the circuitry 372. In some implementations, the connection 350 may include or may be coupled to the physical layer interface 122 of FIG. 2A.

The memory device 303 and the controller 330 are coupled via a connection 320 (e.g., a bus). For example, FIG. 3A illustrates that the connection 320 may include one or more data lines 321, one or more control lines 322, and one or more timing signal lines 323. The connection 320 is coupled to the circuitry 316 and to the second interface 332.

In an illustrative implementation, the system 300 further includes a power supply connection 373 (e.g., a "rail" to provide a power supply voltage, such as VDD, VCC, or both). The power supply connection 373 may be coupled to the memory device 303, the controller 330, and the host processing device 374. Depending on the particular implementation, the power supply connection 373 may be supplied by a battery (e.g., a mobile device battery) or by a power supply device (e.g., a transformer) coupled to a main power supply. In other implementations, the memory device 303, the controller 330, and/or the host processing device 374 are connected to separate power supply connections.

During operation, the controller 330 is configured to receive data and instructions from the host device 370 using the first interface 338. For example, the controller 330 may receive data 360 from the host device 370 via the first interface 338. To further illustrate, the data 360 may be received via the one or more data lines 351 in connection with a request for write access sent via the one or more control lines 352. The data 360 and the request may be received by the controller 330 based on a timing signal 364 (e.g., one or more clock signals, one or more strobe signals, or one or more read enable signals) received via the one or more timing signal lines 353. For example, the first interface 338 may include one or more latches to receive the data 360 based on the timing signal 364. Although FIG. 3A illustrates a single timing signal 364, it should be appreciated that more than one timing signal 364 may be used (e.g., a differential pair of timing signals).

The ECC engine 334 may be configured to receive the data 360 and to generate one or more ECC codewords based on the data 360. The ECC engine 334 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof.

The controller 330 is configured to send data and commands to the memory device 303 using the second interface 332 and to receive data from the memory device 303 using the second interface 332. For example, the controller 330 is configured to send data (e.g., one or more ECC codewords generated by the ECC engine 334) and a write command (e.g., a command 324) to cause the memory device 303 to store the data to a specified address of the memory 304. The write command may specify a physical address of a portion of the memory 304 that is to store the data. To further illustrate, the controller 330 may send the data to the memory device 303 via the one or more data lines 321 in connection with a write command sent via the one or more control lines 322. The memory device 303 may receive the data and the write command based on a timing signal 326 (e.g., one or more clock signals or one or more strobe signals) provided by the controller 330 via the one or more timing signal lines 323. For example, the circuitry 316 may include one or more latches configured to receive the data 360 based on the timing signal 364. The memory device 303 may cause the read/write circuitry to write the data to the memory 304 based on the timing signal 326. Although FIG. 3A illustrates a single timing signal 326, it should be appreciated that more than one timing signal 326 may be used (e.g., a differential pair of timing signals). Further, in some cases, the timing signal 326 may include a signal generated by the memory device 303, such as a read enable signal.

The controller 330 is configured to send a read command (e.g., the command 324) to the memory device 303 to access data from a specified address of the memory 304. For example, the controller 330 may send the read command to the memory device 303 in response to receiving a request for read access from the host device 370. The read command may specify the physical address of a portion of the memory 304. For example, the read command may specify the physical address of a portion of the memory 304 storing the data. In response to the read command, the memory device 303 may cause the read/write circuitry 310 to sense the portion of the memory 304 storing the data to generate sensed data (e.g., a representation of the data that may differ with respect to the data due to one or more bit errors).

The controller 330 is configured to receive the sensed data from the memory device 303 via the second interface 332. The controller 330 may input the sensed data to the ECC engine 334 to initiate a decoding process to correct one or more bit errors in the sensed data (if any) up to a particular error correction capability of the particular ECC technique. The ECC engine 334 may include a Hamming decoder, an RS decoder, a BCH decoder, an LDPC decoder, a turbo decoder, a decoder configured to decode data according to one or more other ECC schemes, or a combination thereof.

In response to decoding the sensed data, the ECC engine 334 may output the data 360. The controller 330 may provide the data 360 to the host device 370 using the first interface 338.

The host device 370 may periodically or occasionally initiate a first adjustment process (e.g., a phase delay calibration or "tuning" process) associated with the first interface 338. For example, the first adjustment process may include adjusting the timing signal 364 (e.g., by adjusting phase of the timing signal 364). During the first adjustment process, the host device 370 may send (e.g., using the circuitry 372) data (e.g., the data 360) to the controller 330. The controller 330 may receive the data using the first interface 338, such as using one or more latches of the first interface 338. Alternatively or in addition, the first adjustment process may include receiving data (e.g., the data 360) from the controller 330 by the host device 370.

In some implementations, the host device 370 initiates the first adjustment process in response to a power-on event at the system 300. Alternatively or in addition, the host device 370 may initiate the first adjustment process in response to one or more other events, such as an error in connection with a request for read access or a request for write access (e.g., due to a temperature change or a voltage change at the system 300) and/or during an idle time associated with the data storage device 302 (e.g., if the host device 370 is not requesting read access or write access).

Prior to the host device 370 initiating the first adjustment process, the controller 330 may receive a message 362 specifying that the host device 370 is to perform the first adjustment process. For example, FIG. 1 illustrates that the controller 330 may receive the message 362 via the one or more control lines 352. In other implementations, the controller 330 may receive the message 362 via another technique (e.g., via the one or more data lines 351, or via a dedicated bus or connection, as illustrative examples).

In some implementations, the message 362 complies with an interface protocol, such as an interface protocol in accordance with an industry standard. For example, the first interface 338 may comply with a MultiMedia Card (MMC) standard, such as an embedded MultiMedia Card (eMMC) standard. In this case, the message 362 may include a command that complies with an MMC or eMMC standard. As another example, the first interface 338 may comply with a Serial Advanced Technology Attachment (SATA) standard, and the message 362 may include a command that complies with the SATA standard. As an additional example, the first interface 338 may comply with a Universal Serial Bus (USB) standard, and the message 362 may include a command that complies with the USB standard.

The controller 330 is configured to initiate a second adjustment process (e.g., a phase delay calibration or "tuning" process) associated with the second interface 332 in response to the message 362. For example, the interface timing adjustment engine 134 may be configured to adjust the timing signal 326 (e.g., by adjusting phase of the timing signal 326). In an illustrative implementation, the interface timing adjustment engine 134 initiates the second adjustment process in response to receiving the message 362 to enable the data storage device 302 to perform the second adjustment process in response to the host device 370 performing the first adjustment process. Performing the second adjustment process during the first adjustment process may cause the first adjustment process to be affected by the second adjustment process (e.g., due to noise at the first interface 338 as a result of operation of the second interface 332), resulting in a more robust first adjustment process (and vice versa).

To further illustrate, certain examples of operations that may be performed during the second adjustment process are described below. It should be appreciated that the examples are illustrative and that the scope of the disclosure is not limited to the described examples. To illustrate, one or more operations of one of the examples below may be combined with one or more operations of another of the examples without departing from the scope of the disclosure. Those of skill in the art will recognize that other modifications of the described examples are within the scope of the disclosure.

The second adjustment process may include one or more of writing data to the memory 304 during the first adjustment process or reading data from the memory 304 during the first adjustment process. To illustrate, in response to receiving the message 362, the interface timing adjustment engine 134 may cause the second interface 332 to send data 306 and a write command (e.g., the command 324) to the circuitry 316 using the connection 320. The write command may specify one or more physical addresses of the memory 304, such as a physical address of the storage region 308. Upon receiving the data 306 at the circuitry 316, the memory device 303 may cause the read/write circuitry 310 to program the data 306 to the memory 304. In response to programming the data 306 to the memory 304, the memory device 303 may send a status indication to the controller 330 indicating a status of the write operation (e.g., a pass or fail status).

In some implementations, the data 306 may include "dummy" data (e.g., a predetermined set of bits or a pseudo-randomly generated set of bits). In this case, the controller 330 may be configured to update the file table 340 to indicate that the data 306 is invalid (e.g., after receiving the status indication from the memory device 303 indicating a pass status of the write operation). In other cases, the data 306 may include user data. In this case, the controller 330 may be configured update the file table 340 to indicate that the data 306 is valid (e.g., after receiving the status indication from the memory device 303 indicating a pass status of the write operation).

Alternatively or in addition to writing data to the memory 304, the second adjustment process may include reading data from the memory 304 and receiving the data at the controller 330 using the second interface 332. For example, the controller 330 may send a read command (e.g., the command 324) to the memory device 303 using the connection 320. The read command may specify the physical address of the storage region 308. The memory device 303 may cause the read/write circuitry 310 to sense the storage region 308 to generate sensed data 328. The memory device 303 may provide the sensed data 328 to the controller 330 using the connection 320, and the controller 330 may receive the sensed data 328 using the second interface 332.

Alternatively or in addition to writing data to the memory 304 and/or reading data from the memory 304, the second adjustment process may include erasing data at the memory 304. For example, the controller 330 may send an erase command (e.g., the command 324) to the memory device 303 using the connection 320. The erase command may specify a physical address of a storage region. To illustrate, if erase command specifies the physical address of the storage region 308, the memory device 303 may cause the read/write circuitry 310 to erase the data 306 from the storage region 308. After erasing the data 306, the controller 330 may be configured to update the file table 340 to indicate that the storage region 308 is available for write operations. In some cases, the controller 330 is configured to rewrite the data 306 during the second adjustment process (such as if the data 306 includes valid user data). In other cases, the controller 330 may not rewrite the data 306 during the second adjustment process (e.g., if the data 306 is "dummy" data).

In some implementations, the controller 330 is configured to randomly or pseudo-randomly select the storage region 308. For example, the controller 330 may be configured to pseudo-randomly select one or more physical addresses storing valid data by accessing the file table 340. In this example, the controller 330 may be configured to pseudo-randomly select a physical address of the storage region 308 from the file table 340 in response to receiving the message 362 and to write or read data based on the selected physical address. Depending on the particular implementation, the controller 330 may select between physical addresses of the memory 304 storing valid data, physical addresses of the memory 304 storing invalid data, or both.

In another example, the storage region 308 may include a "dedicated" storage area that is reserved for operations performed during the second adjustment process. For example, the storage region 308 may include a storage area that has been closed to write operations (e.g., due to a malfunction, a defect, or a high number of program/erase cycles). In this case, the data 306 may include dummy data (instead of user data).

In some implementations, the ECC engine 334 may perform one or more ECC operations (e.g., encoding operations and/or decoding operations) during the second adjustment process. To illustrate, in some implementations, the ECC engine 334 may encode data to generate the data 306 during the second adjustment process. Alternatively or in addition, the ECC engine 334 may decode the sensed data 328 to generate decoded data during the second adjustment process. In an illustrative implementation, the ECC engine 334 performs ECC operations in response to the controller 330 sending or receiving data at the connection 320 during the second adjustment process.

In some implementations, the controller 330 may send data to and receive data from one or more latches of the circuitry 316 without causing the memory device 303 to program the data to and sense the data from the memory 304. For example, the controller 330 may be configured to send the data 306 and a command (e.g., the command 324) to the circuitry 316 using the connection 320. In some implementations, the command 324 indicates that the memory device 303 is to "hold" the data 306 in one or more latches of the circuitry 316 (e.g., without programming the data 306 to the memory 304). The controller 330 may retrieve the data 306 from one or more latches of the circuitry 316 via the connection 320 during the second adjustment process. Thus, in some implementations the second adjustment process includes latch-based operations (e.g., does not include writing data to or reading data from the memory 304), and in some implementations the second adjustment process includes memory-based operations (e.g., by writing data to and/or reading data from the memory 304 during the second adjustment process).

Depending on the particular application, a latch-based adjustment process may generate more noise at the connection 320 as compared to a memory-based adjustment process. For example, if data is not written to and/or read from the memory 304 during the second adjustment process, the connection 320 may remain charged during the second adjustment process (e.g., due to a capacitive effect associated with values stored in one or more latches of the circuitry 316). A latch-based adjustment process may be advantageous in applications where the connection 350 is sensitive to noise generated at the connection 320 (e.g., if the connection 350 is located near the connection 320). In some cases, a memory-based adjustment process may generate more noise at the power supply connection 373 as compared to a latch-based adjustment process. For example, use of programming voltages and/or read voltages during programming and/or read operations may generate noise at the power supply connection 373. A memory-based adjustment process may be advantageous in applications where one or both of the connections 320 are sensitive to power supply noise (e.g., if one or both of the connections 320 are sensitive to "glitches" in a supply voltage provided by the power supply connection 373, such as glitches that are due to capacitance and/or inductance that may be associated with the power supply connection 373).

Alternatively or in addition to latch-based operations and memory-based operations, the second adjustment process may include ECC-based operations (e.g., by performing one or more encoding operations and/or one or more decoding operations at the ECC engine 334 during the second adjustment process). In some applications, operation of the ECC engine 334 during the second adjustment process may affect operation of the connection 350, such as by generating noise at the power supply connection 373 that affects the connection 350. In an illustrative implementation, the second adjustment process may be performed in accordance with a "full power" mode during which data is encoded, sent to the circuitry 316, written to the memory 304, sensed from the memory 304, provided to the second interface 332, and decoded by the ECC engine 334. A "full power" mode may be advantageous if the second adjustment process is to provide a "worst case" amount of noise and/or power consumption. For example, certain operations (such as the "full power" mode) may cause a "peak" power usage that temporarily reduces a level of a supply voltage provided by the power supply connection 373. In this case, performance of one or more interface drivers may be temporarily reduced, resulting in a "worst case" operating condition.

In some cases, the data storage device 302 may "extend" the second adjustment process (e.g., by repeating the second adjustment process one or more times or by performing one or more other operations) if the second adjustment process terminates prior to termination of the first adjustment process performed by the host device 370. To illustrate, the host device 370 may indicate termination of the first adjustment process either directly (e.g., using a particular command) or indirectly (e.g., by ceasing to use the connection 350 or by sending a read command or a write command to the data storage device 302). In some implementations, the data storage device 302 is configured to "extend" the second adjustment process until the host device 370 indicates termination of the first adjustment process.

In some cases, the second adjustment process may include performing one or more operations specified by the host device 370. For example, the message 362 may indicate one or more types of operations to be performed during the second adjustment process (e.g., one or more write operations, one or more read operations, one or more encoding operations, one or more decoding operations, one or more other operations, or a combination thereof), a number of operations to be performed during the second adjustment process, a duration of the second adjustment process, or a combination thereof. To further illustrate, in some cases the message 362 may include a field (e.g., a bit) indicating whether the data storage device 302 is to perform the second adjustment process in accordance with the "full power" mode. For example, if the system 300 is implemented as a battery-powered device (e.g., a mobile device or a laptop device, as illustrative examples), the field may indicate use of the "full power" mode based on an amount of battery charge satisfying a threshold and/or if the system 300 is currently connected to a main power supply for charging of the battery. It is noted that the disclosure is not limited to these examples and that the system 300 may be implemented as another device (e.g., a server, a cloud storage device, or a desktop computer, as illustrative examples).

The second adjustment process may further include adjusting a phase of the timing signal 326. For example, the interface timing adjustment engine 134 may be configured to adjust the phase of the timing signal 326 in connection with the second adjustment process during one or more of the foregoing operations. In an illustrative implementation, the interface timing adjustment engine 134 is configured to detect bit transitions in data sent or received using the connection 320 during the second adjustment process and to position edges of the timing signal 326 between the bit transitions (e.g., in the "middle" of bits) so that the timing signal 326 is approximately 90 degrees out of phase with respect to the bit transitions.

In some implementations, the interface timing adjustment engine 134 may use the timing device 336 to adjust the phase of the timing signal 326. As an illustrative example, the timing device 336 may include one or more of a phase-locked loop (PLL) device or a delay-locked loop (DLL) device to generate and/or adjust a phase of the timing signal 326. In this example, the PLL device or the DLL device may be responsive to the interface timing adjustment engine 134 to adjust a phase of the timing signal 326.

Alternatively or in addition, the second adjustment process may include performing multiple memory access operations (e.g., multiple read operations, multiple write operations, or both) at the memory device 303 using multiple different phases of the timing signal 326. As an illustrative example, the controller 330 may initiate a first read operation to the data 306 using a first phase of the timing signal 326 to generate first sensed data, a second read operation to the data 306 using a second phase of the timing signal 326 (e.g., the first phase plus or minus approximately 10 degrees) to generate second sensed data, and an nth read operation to the data 306 using an nth phase of the timing signal (e.g., the first phase plus or minus a particular number of degrees) to generate nth sensed data (where n indicates a positive integer greater than two). For example, the particular number of degrees may be equal to (n−1)*5 or (n−1)*10, as illustrative examples.

The controller 330 may determine a first number of errors associated with the first sensed data, a second number of errors of the second sensed data, and an nth number of errors of the nth sensed data. For example, the controller 330 may compare sensed data to a copy of the data 306 to determine whether each bit of the sensed data "matches" a corresponding bit of the copy of the data 306. To further illustrate, the controller 330 may compare the first sensed data, the second sensed data, and the nth sensed data to a copy of the data 306 stored at (e.g., temporarily retained at) the controller 330 to determine the first number of errors, the second number of errors, and the nth number of errors. In an illustrative implementation, the controller 330 includes an exclusive-or (XOR) device configured to perform a first set of XOR operations using the first sensed data and the copy of the data 306 to determine the first number of errors, a second set of XOR operations using the second sensed data and the copy of the data 306 to determine the second number of errors, and an nth set of XOR operations using the nth sensed data and the copy of the data 306 to determine the nth number of errors.

In another implementation, the ECC engine 334 may be configured to determine the first number, the second number, and the nth number, such as by decoding the first sensed data, the second sensed data, and the nth sensed data. The ECC engine 334 may be configured to provide a first indication of the first number of errors, a second indication of the second number of errors, and an nth indication of the nth number of errors to the interface timing adjustment engine 134.

The interface timing adjustment engine 134 may be configured to select between the first phase, the second phase, and the nth phase by selecting a least number of errors of the first number, the second number, and the nth number. For example, if the second number is less than the first number and the nth number, then the interface timing adjustment engine 134 may select the second phase of the timing signal 326. The interface timing adjustment engine 134 may provide an indication of the selected phase (e.g., the second phase) to the timing device 336 to cause the timing device 336 to adjust the timing signal 326 based on the selected phase (e.g., by delaying or advancing phase of the timing signal 326).

In some cases, the interface timing adjustment engine 134 may be determine that the second adjustment process has "failed" (e.g., if each the first number, the second number, and the nth number exceeds a threshold number of errors). In this case, the interface timing adjustment engine 134 may initiate another adjustment process. For example, the interface timing adjustment engine 134 may "incrementally" change phase of the timing signal 326 by a particular amount (e.g., by five degrees, or another amount) during one or more of a write operation or a read operation targeting the memory 304 to find a "best" phase adjustment amount.

In some implementations, the first adjustment process and/or the second adjustment process may include adjusting a voltage level (e.g., "drive strength") of one or more signals. For example, during the second adjustment process, the interface timing adjustment engine 134 may adjust a voltage level of a voltage used at the connection 320, such as by adjusting operation of the one or more voltage regulators 342 (e.g., by selectively activating or deactivating one or more voltage divider devices included in the one or more voltage regulators 342). Adjusting the drive strength may modify a rise time or a fall time associated with a signal. Further, although FIG. 3A illustrates that the one or more voltage regulators 342 are included in the controller 330, it should be appreciated that one or more voltage regulators may be included in the memory device 303 alternatively or in addition to the controller 330.

After performing the second adjustment process, the data storage device 302 may continue operation (e.g., by responding to requests for read access or write access from the host device 370). For example, the controller 330 may send data to and receive data from the memory device 303 using the adjusted phase of the timing signal 326 determined during the second adjustment process. The controller 330 may subsequently initiate one or more additional second adjustment processes, such as in response to an error at the second interface 332 or in response to receiving another message from the host device 370 specifying that another first adjustment process is to be performed.

The examples described with reference to FIG. 3A may enable the first adjustment process performed by the host device 370 to compensate for effects on the connection 350 that are due to operations at the connection 320 (and vice versa), resulting in more accurate phase adjustment of the timing signal 364 (and more accurate phase adjustment of the timing signal 326). Operation of the system 300 is therefore improved as compared to a conventional device that uses separate (or "non-overlapping") adjustment processes (e.g., due to fewer errors and/or due to less frequent adjustment processes at the system 300 after the adjustment processes are completed).

Figure 3B:
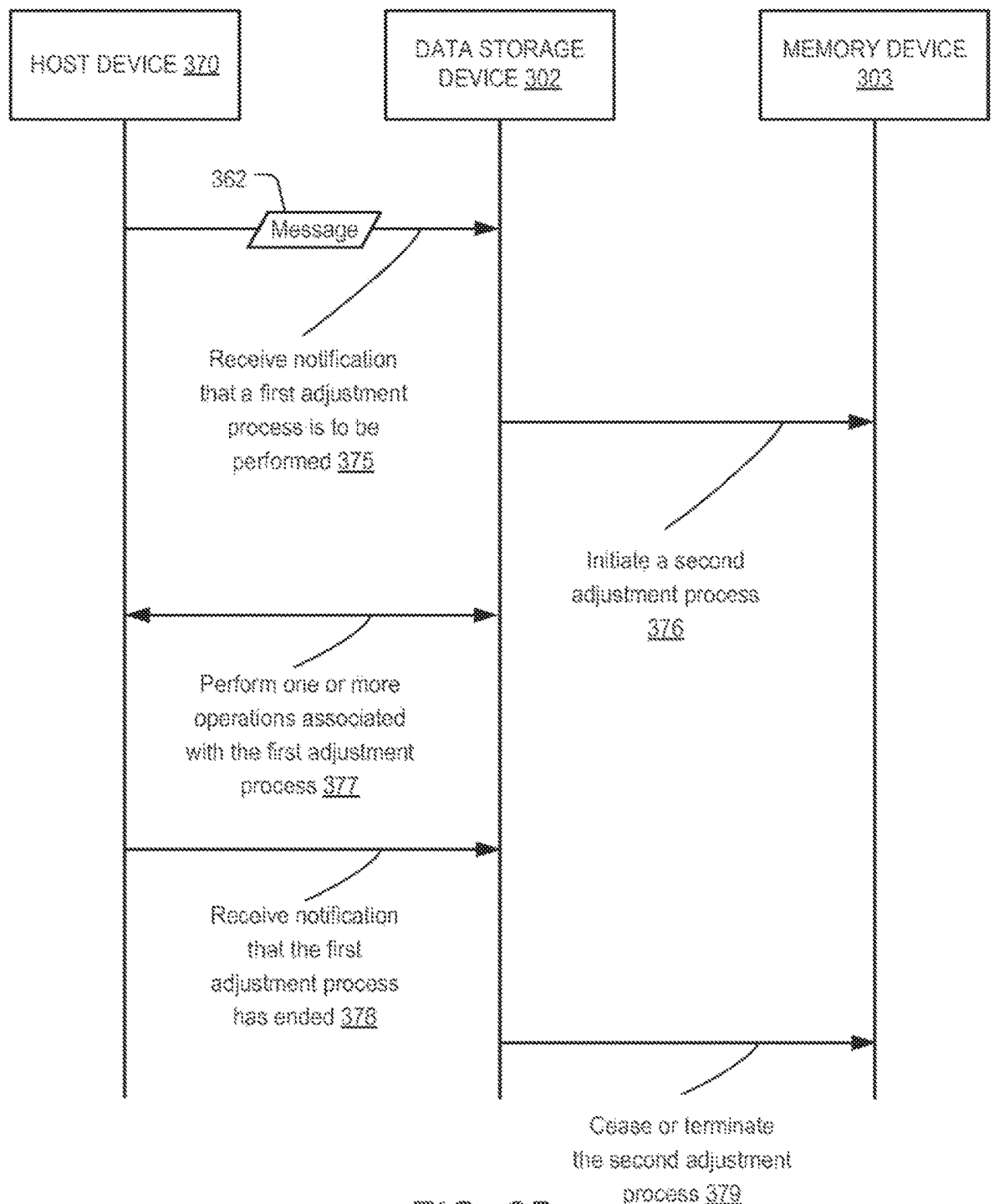
FIG. 3B is a timing diagram illustrating certain operations that may be performed at a system, such as at the system of FIG. 3A.

FIG. 3B depicts an illustrative timing diagram illustrating operations that may be performed at a system, such as the system 300 of FIG. 3A. For example, the operations of FIG. 3B may be performed by the data storage device 302 of FIG. 3A.

The operations of FIG. 3B include receiving notification that a first adjustment process is to be performed, at 375. For example, the controller 330 may receive the message 362 from the host device 370, and the message 362 may specify that the host device 370 is to perform the first adjustment process described with reference to FIG. 3A using the connection 350 of FIG. 3A.

The operations of FIG. 3B may further include initiating a second adjustment process, at 376. For example, the controller 330 of FIG. 3A may initiate the second adjustment process described with reference to FIG. 3A at the connection 320. The second adjustment process may be performed until the controller 330 terminates the second adjustment process (e.g., at 379). Performing the second adjustment process during the first adjustment process may enable adjustment based on a wide range of operating conditions (e.g., by generating noise at either of the connections 320, 350 of FIG. 3A) as compared to performing the adjustment processes separately (which may result in adjustment based on a narrower or "optimistic" range of operating conditions).

The operations of FIG. 3B may further include performing one or more operations associated with the first adjustment process, at 377. For example, the one or more operations may include receiving data from the host device 370 via the connection 350. Alternatively or in addition, the one or more operations may include sending data to the host device 370 via the connection 350.

In some implementations, the operations of FIG. 3B may further include receiving notification that the first adjustment process has ended (or is to be terminated), at 378. For example, certain communication protocols may specify that the host device 370 is to provide explicit notification that the first adjustment process has ended (or is to be terminated). In other implementations, notification that the first adjustment process has ended (or is to be terminated) may not be received. For example, one or more of the first adjustment process or the second adjustment process may "time out" after a particular time interval.

The operations of FIG. 3B may further include ceasing or terminating the second adjustment process, at 379. As an example, the controller 330 of FIG. 3A may cease to perform operations of the second adjustment process and may instead await one or more requests for access to the memory 304 from the host device 370.

The operations of FIG. 3B may enable the first adjustment process to compensate for effects such as noise (e.g., thermal noise, power supply noise, or a combination of both) that are due to the second adjustment process (and vice versa). Thus, a process in accordance with FIG. 3B may result in more accurate phase adjustment of the timing signal 364 of FIG. 3A (and more accurate phase adjustment of the timing signal 326 of FIG. 3A). Device operation is therefore improved as compared to a conventional device that uses separate adjustment processes (e.g., by enabling a wide range of operating conditions during the adjustment processes instead of using a narrower or "optimistic" range of operating conditions).

Figure 3C:
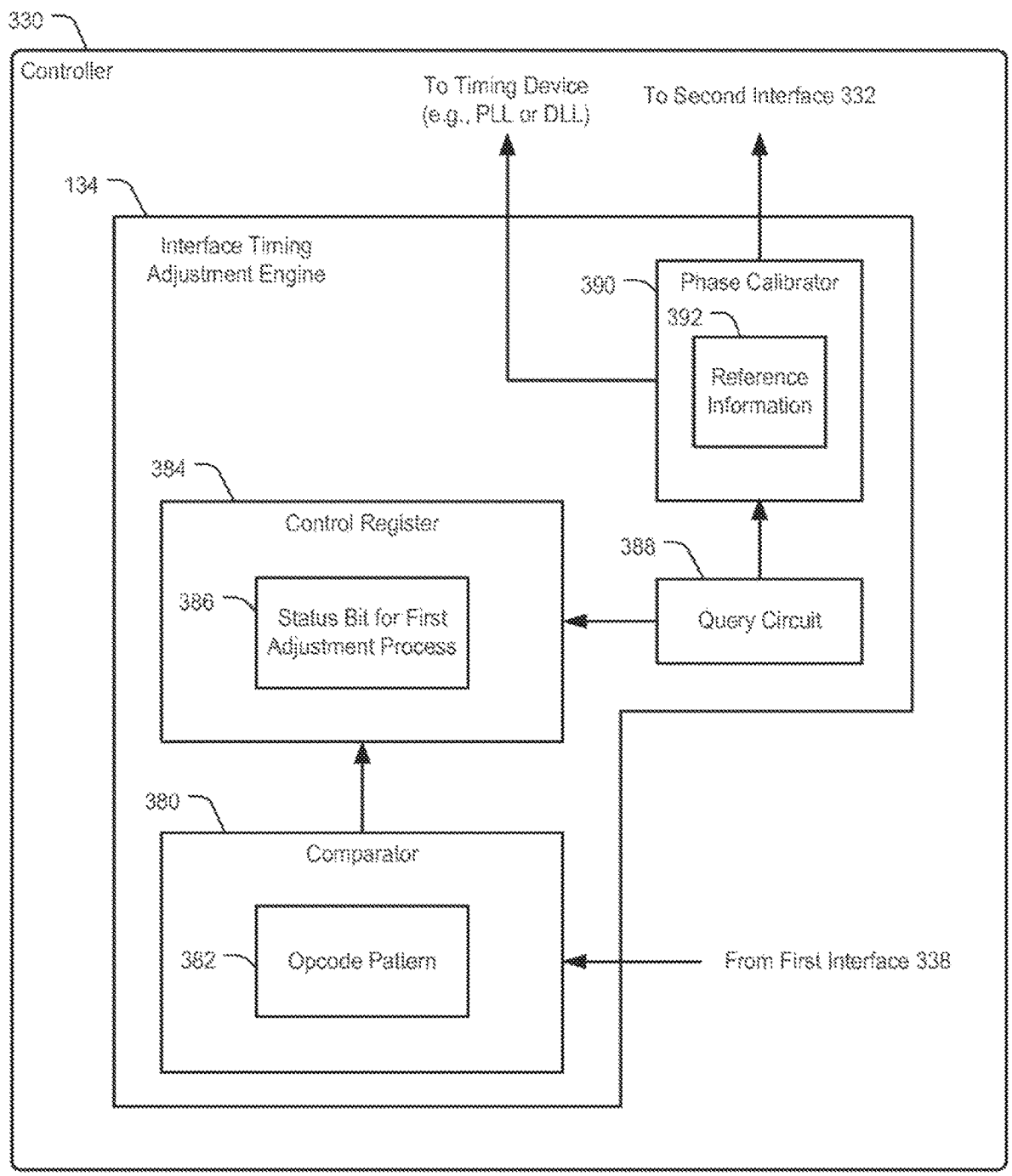
FIG. 3C is a block diagram of an illustrative example of an interface timing adjustment engine, such as the interface timing adjustment engine of FIGS. 1-3.

FIG. 3C depicts certain illustrative components that may be included in the interface timing adjustment engine 134 of the controller 330 of FIG. 3A. It should be appreciated that the example of FIG. 3C is illustrative and that other implementations are within the scope of the disclosure. For example, one or more components of the interface timing adjustment engine 134 may be selected based on the particular application and may differ from the particular example of FIG. 3C.

In the example of FIG. 3C, the interface timing adjustment engine 134 includes a comparator 380, a control register 384, a query circuit 388, and a phase calibrator 390. The comparator 380 may be coupled to the connection 350 of FIG. 3A and to the control register 384. The query circuit 388 is coupled to the control register 384 and to the phase calibrator 390. The phase calibrator 390 is coupled to the connection 320 of FIG. 3A and to the timing device 336 of FIG. 3A. The comparator 380 is configured to store or access an opcode pattern 382, the control register 384 is configured to store a status bit 386, and the phase calibrator 390 is configured to store or access reference information 392.

During operation, the comparator 380 may monitor the one or more control lines 352 of FIG. 3A to detect one or more messages, such as by comparing opcodes of messages sent via the one or more control lines 352 to determine whether one or more of the opcodes corresponds to (or "matches") the opcode pattern 382. For example, the comparator 380 may monitor the one or more control lines 352 to detect the message 362 by determining that the message 362 corresponds to the opcode pattern 382. To further illustrate, in some implementations, the comparator 380 may include a register configured to latch in (e.g., sample or "snoop") opcodes provided via the one or more control lines 352. The comparator 380 may include logic circuitry (e.g., a plurality of AND gates) configured to provide an enable signal to the control register 384 in response to detecting that a latched opcode "matches" the opcode pattern 382. As an illustrative example, the logic circuitry may include a set of AND gates, and each of the AND gates may have a first input configured to receive a corresponding value of the latched opcode and a second input configured to receive a corresponding value of the opcode pattern 382. A "master" AND gate (e.g., an AND gate having three or more inputs)

may be coupled to receive an output of each of the set of AND gates and to generate the enable signal when each of the outputs has a logic one value.

In some implementations, the message 362 includes a command that complies with an eMMC standard. In this case, the opcode pattern 382 may correspond to a command that complies with an eMMC standard. In other implementations, the message 362 includes a command that complies with one or more other standards, such as a SATA standard or a USB standard, as illustrative examples. In these examples, the opcode pattern 382 may correspond to a command that complies with a SATA standard or that complies with a USB standard.

In response to determining that the message 362 corresponds to the opcode pattern 382, the comparator 380 may set a value of the status bit 386 at the control register 384 to indicate that the host device 370 of FIG. 3A is to perform the first adjustment process. For example, the comparator 380 may be configured to change the value of the status bit 386 from a logic zero value to a logic one value in response to determining that the message 362 corresponds to the opcode pattern 382.

The query circuit 388 is configured to monitor (e.g., query) the control register 384 to determine whether the value of the status bit 386 indicates that the host device 370 of FIG. 3A is to perform the first adjustment process. In response to detecting that the status bit 386 indicates that the host device 370 of FIG. 3A is to perform the first adjustment process, the query circuit 388 may provide a signal (e.g., an enable signal) to the phase calibrator 390.

In response to receiving the signal from the query circuit 388, the phase calibrator 390 may be configured to initiate the second adjustment process. To illustrate, the second adjustment process may include memory access operations (e.g., read operations, write operations, or a combination of both) initiated by the phase calibrator 390. The memory access operations may target a memory (e.g., the memory 304 of FIG. 3A, or another memory) using the connection 320 and may be performed based on the timing signal 326 of FIG. 3A. For example, the phase calibrator 390 may be configured to adjust the phase of the timing signal 326 (e.g., using the timing device 336 of FIG. 3A, which may include a PLL or a DLL, as illustrative examples) and to detect bit transitions in particular data communicated using the connection 320 by comparing the particular data to the reference information 392. As an illustrative example, the phase calibrator 390 may read the particular data using multiple phases of the timing signal 326 and may determine a number of errors associated with each of the phases based on the reference information 392. The phase calibrator 390 may be configured to select a phase of the multiple phases associated with the least number of errors.

The example of FIG. 3C may enable the first adjustment process to compensate for effects that are due to the second adjustment process (and vice versa), resulting in more accurate phase adjustment of the timing signals 326, 364. For example, performing the second adjustment during the first adjustment process may enable compensation for effects such as noise (e.g., thermal noise, power supply noise, or a combination of both) and fluctuations in supply voltage level that are due to the adjustment processes. Device operation may therefore be improved as compared to a conventional device that uses separate (or "non-overlapping") adjustment processes.

Figure 4:
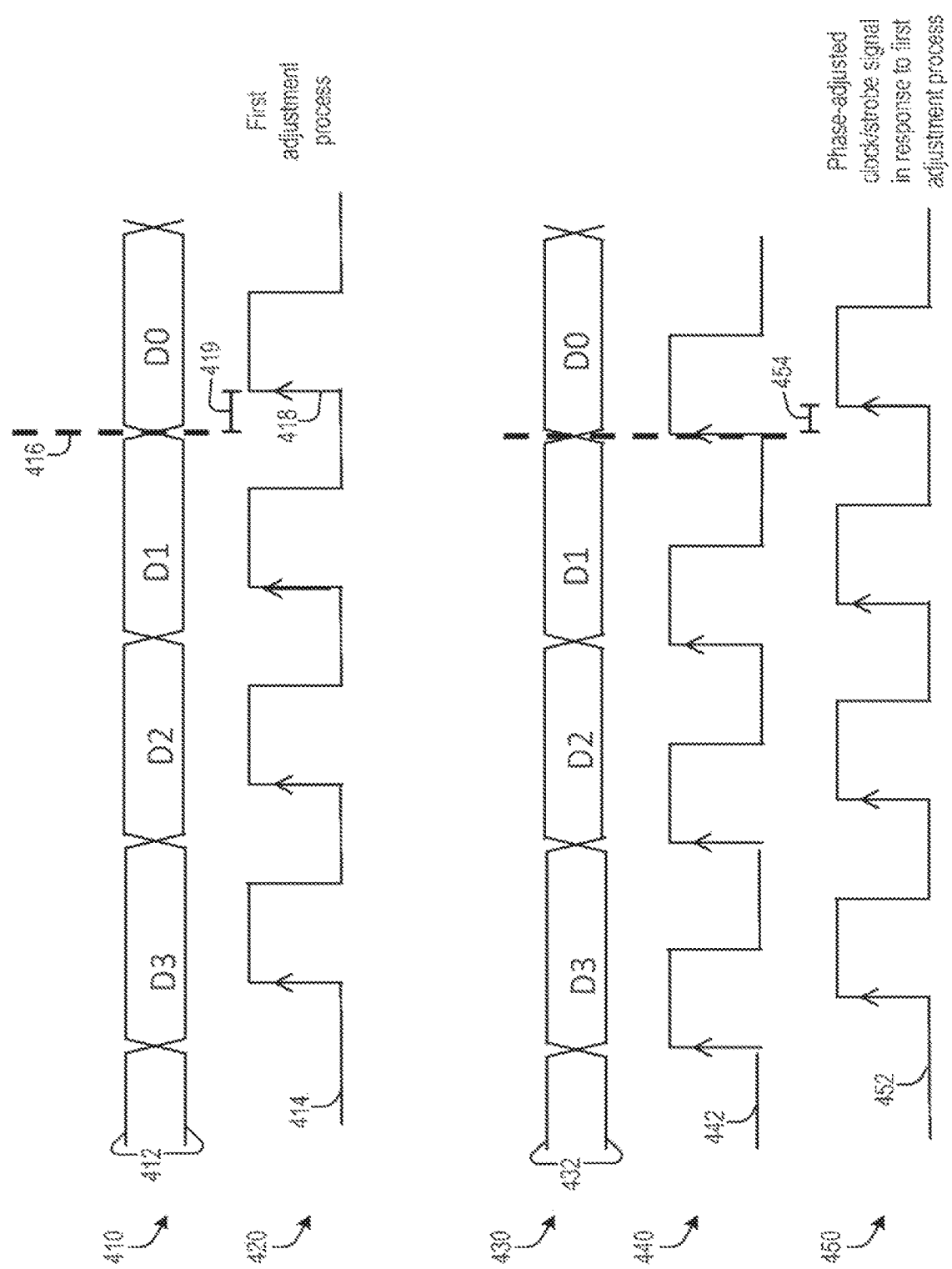
FIG. 4 illustrates timing diagrams associated with an example of a write process that may be included in an adjustment process.

FIG. 4 illustrates timing diagrams 410, 420, 430, 440, and 450 associated with a write process that may be included in adjustment processes. For example, the timing diagrams 410, 420 may illustrate timing of signals at the connection 350 during the first adjustment process described with reference to FIG. 3A, and the timing diagrams 430, 440, and 450 may illustrate timing of signals at the connection 320 during the second adjustment process described with reference to FIG. 3A.

The timing diagram 410 depicts bit transitions associated with data 412. The data 412 includes a first value D0, a second value D1, a third value D2, and a fourth value D3. For example, the data 412 may correspond to the data 360 and may be sent from the host device 370 to the controller 330 using the one or more data lines 351 in connection with a write command sent using the one or more control lines 352. Although the data 412 in FIG. 4 may correspond to sequential values sent using a differential technique, it should be appreciated that FIG. 4 is illustrative and that other configurations are within the scope of the disclosure (e.g., transmission of the data 412 using a parallel technique and/or a single-ended technique).

The timing diagram 420 depicts timing of a timing signal 414 (e.g., the timing signal 364) that is phase delayed with respect to bit transitions of the data 412. For example, an edge 418 of the timing signal 414 is delayed with respect to a bit transition 416 associated with the first value D0 according to a phase delay 419. The phase delay 419 may enable the first value D0 to stabilize (or "settle") at the connection 320 (e.g., at the one or more data lines 351) and/or at one or more components of the first interface (e.g., at one or more latches of the first interface 338) prior to the controller 330 sampling the first value D0 based on the edge 418 of the timing signal 414. In some implementations, the first adjustment process performed by the host device 370 includes adjusting a duration of the phase delay 419 (e.g., in connection with a write operation performed during the first adjustment process).

The timing diagrams 430, 440 illustrate that data 432 (e.g., the data 306) may be sent from the controller 330 to the memory device 303 via the one or more data lines 321 using a clock or strobe signal 442 (e.g., the timing signal 326). Because edges of the clock or strobe signal 442 occur near bit transitions of the data 432, receiving the data 432 at the circuitry 316 based on the clock or strobe signal 442 may cause the circuitry 316 to sample one or more "wrong" values of the data 432. Accordingly, the interface timing adjustment engine 134 may adjust a phase of the clock or strobe signal 442 to generate a phase-adjusted (e.g., phase-delayed) clock or strobe signal 452. For example, the phase-adjusted clock or strobe signal 452 may be phase-adjusted with respect to the clock or strobe signal 442 based on a phase delay 454. Depending on the particular application, the phase delay 454 may be the same as, similar to, or different than (e.g., independent of) the phase delay 419.

By performing write operations described with reference to FIG. 4 concurrently (e.g., so that the write operations at least partially overlap in time), operation of both the interfaces 332, 338 may be adjusted (e.g., "tuned") under "worst case" conditions. As a result, signal integrity at the interfaces 332, 338 may be improved as compared to a conventional device that uses separate adjustment processes, reducing a number of errors during operation of the data storage device 302.

Figure 5:
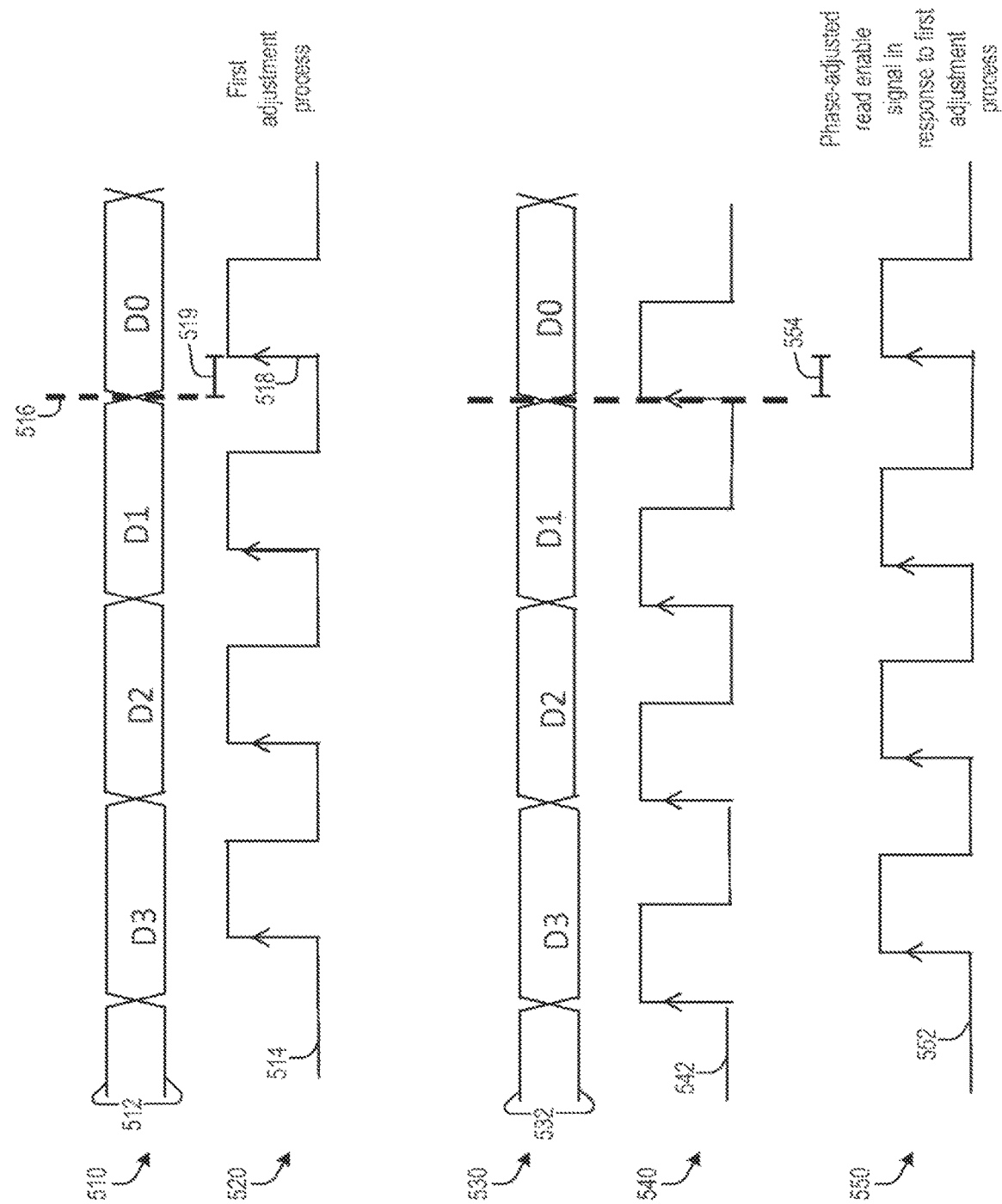
FIG. 5 illustrates timing diagrams associated with an example of a read process that may be included in an adjustment process.

FIG. 5 illustrates timing diagrams 510, 520, 530, 540, and 550 associated with a read process that may be included in adjustment processes. For example, the timing diagrams 510, 520 may illustrate timing of signals at the connection 350 during the first adjustment process described with reference to FIG. 3A, and the timing diagrams 530, 540, and

550 may illustrate timing of signals at the connection 320 during the second adjustment process described with reference to FIG. 3A. It is noted that the operations described with reference to FIG. 5 may be performed alternatively or in addition to the operations of FIG. 4.

The timing diagram 510 depicts bit transitions associated with data 512. The data 512 includes a first value D0, a second value D1, a third value D2, and a fourth value D3. For example, the data 512 may correspond to the data 360 and may be received at the host device 370 from the controller 330 in response to a read command from the host device 370 during the first adjustment process. Although the data 512 may be represented in FIG. 5 as having sequential values sent using a differential technique, it should be appreciated that FIG. 5 is illustrative and that other configurations are within the scope of the disclosure (e.g., transmission of the data 512 using a parallel technique and/or a single-ended technique).

The timing diagram 520 depicts timing of a timing signal 514 (e.g., the timing signal 364) that is phase delayed with respect to bit transitions of the data 512. For example, an edge 518 of the timing signal 514 is delayed with respect to a bit transition 516 associated with the first value D0 according to a phase delay 519. The phase delay 519 may enable the first value D0 to stabilize (or "settle") at the connection 320 (e.g., at the one or more data lines 351) prior to the host device 370 sampling the first value D0 based on the edge 518 of the timing signal 514. In some implementations, the first adjustment process performed by the host device 370 includes adjusting a duration of the phase delay 519 (e.g., in connection with a read process performed during the first adjustment process).

The timing diagrams 530, 540 illustrate that data 532 (e.g., the sensed data 328) may be sent from the memory device 303 to the controller 330 via the connection 320 using a read enable signal 542 (e.g., the timing signal 326). For example, the memory device 303 may be configured to assert the read enable signal 542 in response to loading the data 532 into one or more latches of the memory device 303 in connection with a read process performed during the second adjustment process. Because edges of the read enable signal 542 occur near bit transitions of the data 532, receiving the data 532 at the second interface 332 based on the read enable signal 542 may cause the controller 330 to sample one or more "wrong" values of the data 532. Accordingly, the interface timing adjustment engine 134 may adjust a phase of the read enable signal 542 to generate a phase-adjusted (e.g., phase-delayed) read enable signal 552. For example, the phase-adjusted read enable signal 552 may be phase-delayed with respect to the read enable signal 542 based on a phase delay 554. Depending on the particular application, the phase delay 554 may be the same as, similar to, or different than (e.g., independent of) the phase delay 519.

By performing read operations described with reference to FIG. 5 concurrently (e.g., so that the read operations partially overlap in time), operation of both the interfaces 332, 338 may be adjusted (e.g., "tuned") under "worst case" conditions. As a result, signal integrity at the interfaces 332, 338 may be improved as compared to a conventional device that uses separate adjustment processes, reducing a number of errors during operation of the data storage device 302.

Figure 6:
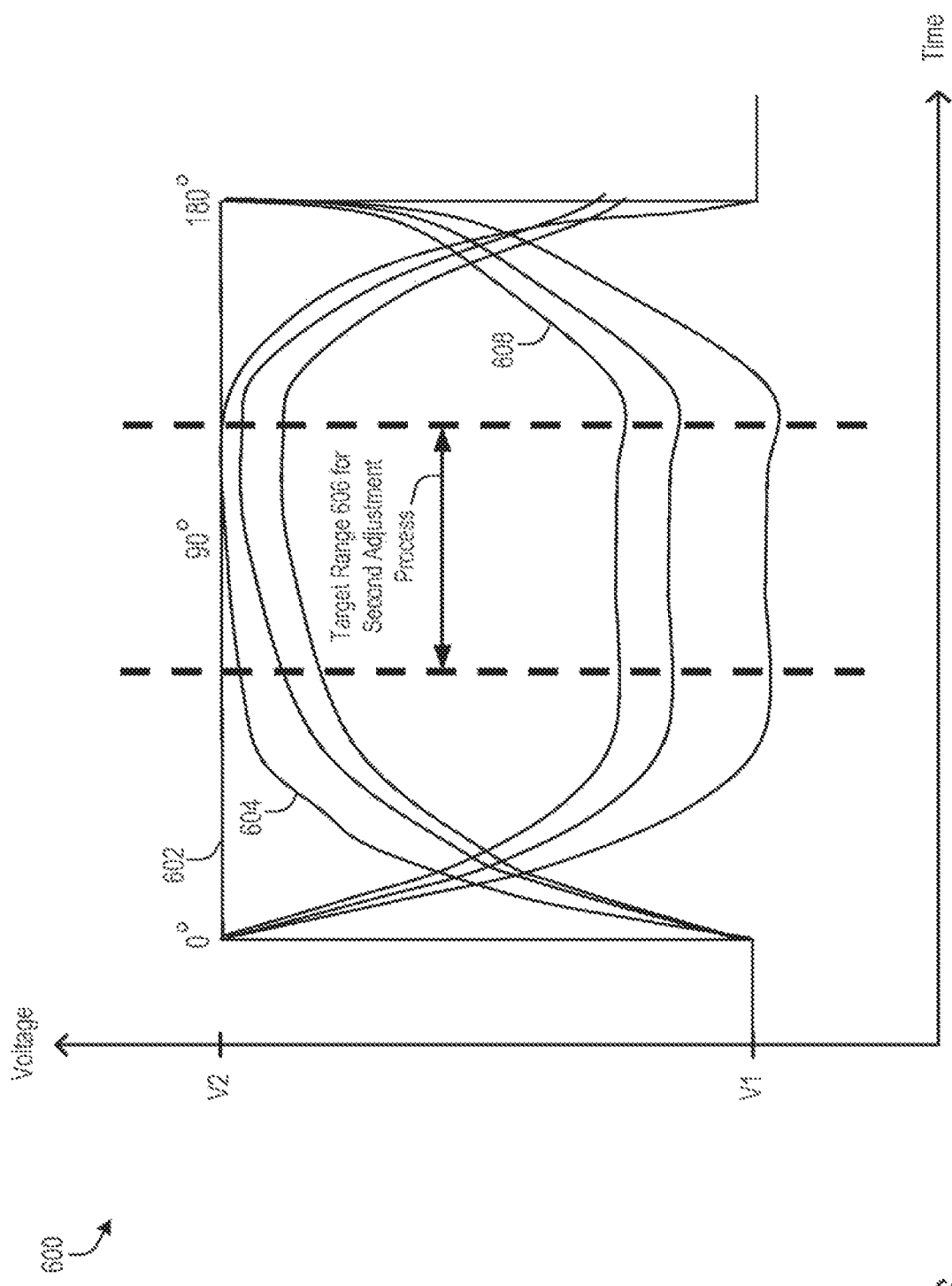
FIG. 6 illustrates an eye diagram depicting a target range for an adjustment process.

FIG. 6 illustrates an eye diagram 600. The eye diagram 600 may represent information that is generated by sampling one or more data lines (e.g., the one or more data lines 321 or the one or more data lines 351) over multiple clock cycles during read operations and/or write operations to generate sampled values, such as a representative high logic value 604 (e.g., a logic "1" value) and a representative low logic value 608 (e.g., a logic "0" value). The eye diagram 600 illustrates that the sampled values may range from a low voltage (V1), such as VSS, to a high voltage (V2), such as VDD or VCC.

For example, the sampled values of the eye diagram 600 may be generated by sampling any of the values described with reference to the data 432, 532 over multiple clock cycles. The sampled values are then "folded" (or superimposed) upon a single clock cycle, such as a clock cycle 602. In at least one implementation, the interface timing adjustment engine 134 is configured to generate information corresponding to the eye diagram 600 during the second adjustment process (e.g., to enable phase adjustment of the timing signal 326.

The interface timing adjustment engine 134 may be configured to position an edge of the timing signal 326 within a target range 606 to improve signal integrity at the second interface 332. To illustrate, if the sampled values of the eye diagram 600 correspond to values of the data 306 and are sent from the controller 330 to the memory device 303 using the connection 320 in connection with a write operation, then an edge of the timing signal 326 should occur within the target range 606 to avoid sampling of the "wrong" values of the data 306. As another illustration, if the sampled values of the eye diagram 600 correspond to values of the sensed data 328 and are sent to the controller 330 from the memory device 303 using the connection 320 in connection with a read operation, then an edge of the timing signal 326 should occur within the target range 606 to avoid sampling of the "wrong" values of the sensed data 328. The eye diagram 600 illustrates that the target range 606 is approximately 90 degrees out of phase with respect to the sampled values. If an edge occurs nearer a bit transition associated with the sampled values (e.g., nearer to a 0 degree phase difference or nearer to a 180 degree phase difference), then incorrect values may be sampled, resulting in errors.

Depending on the particular implementation, the interface timing adjustment engine 134 may be configured to adjust a phase of the timing signal 326 based on a midpoint (or approximate midpoint) of the target range 606. The midpoint may correspond to a 90 degree phase delay of the timing signal 326 relative to data (e.g., the data 306 or the sensed data 328) at the one or more data lines 321. Alternatively or in addition, the interface timing adjustment engine 134 may be configured to initiate multiple data read operations at the memory 304 using multiple phase delays of the target range 606 and to select one of the phase delays corresponding to a lower number of errors (e.g., decoding errors) in read data. In this case, the interface timing adjustment engine 134 may select either a 90 degree phase delay or a different phase delay (e.g., an 85 degree phase delay or a 95 degree phase delay, as illustrative examples) based on which of the phase delays is associated with fewer errors.

By positioning a phase of a timing signal within the target range 606 during the second adjustment process, the interface timing adjustment engine 134 may improve accuracy of sampling of data that is communicated using the connection 320 (e.g., by avoiding sampling near data transitions, which may result in data errors). Further, by adjusting the phase in response to the host device 370 initiating the first adjustment process, accuracy of the adjustment is increased as compared to a conventional device that uses separate adjustment processes (e.g., by causing a "worst case" operating condition due to both interfaces 332, 338 being active).

Although FIG. 6 is described with reference to the data storage device 302, it is noted that the eye diagram 600 may also describe operation of the host device 370. For example, the host device 370 may generate information representing the eye diagram 600 during the first adjustment process (e.g., to enable phase adjustment of the timing signal 364).

Figure 7:
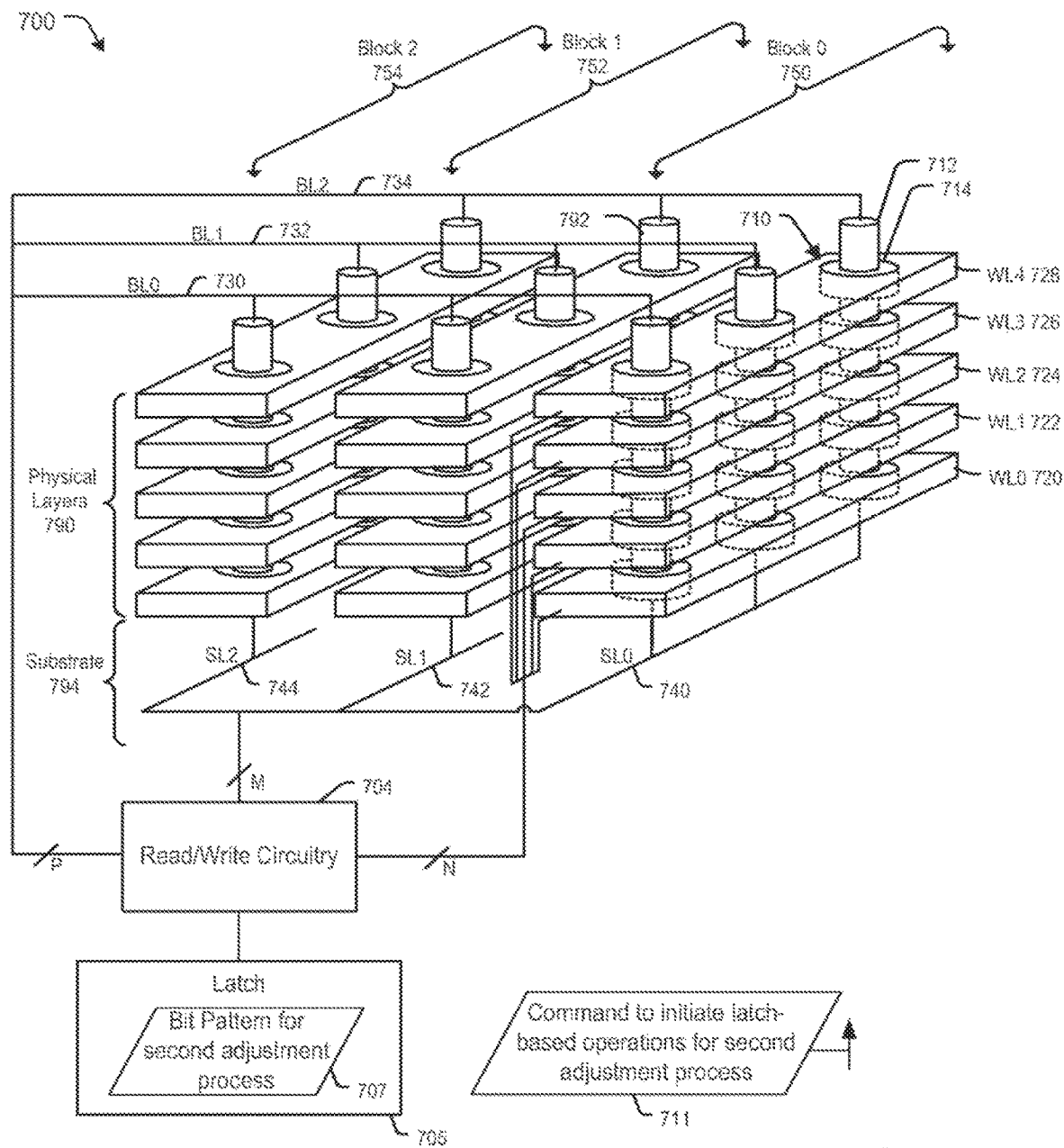
FIG. 7 is a diagram of an illustrative example of a portion of a memory die that may be included in a data storage device.
Figure 8:
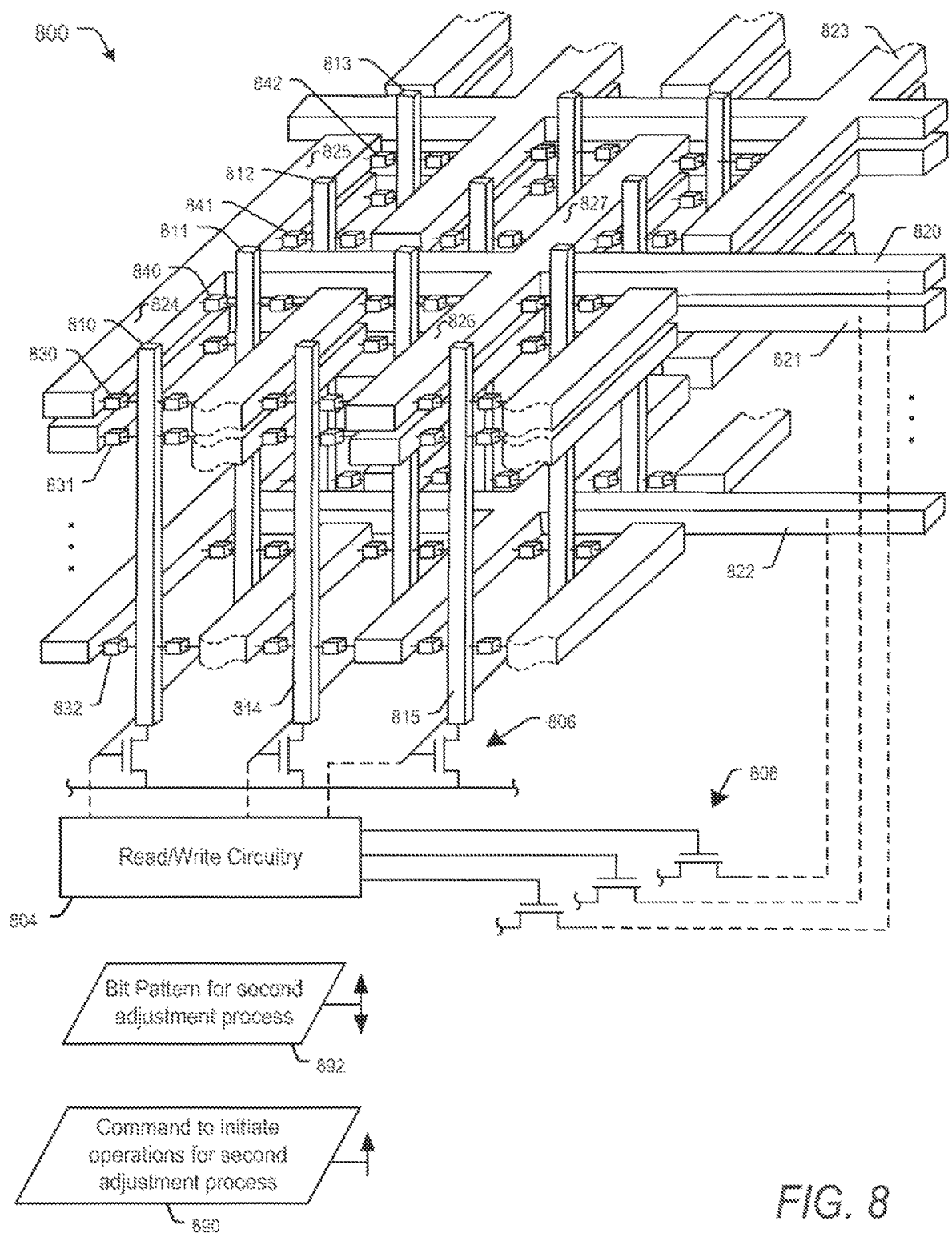
FIG. 8 is a diagram of another illustrative example of a portion of a memory die that may be included in a data storage device.

FIGS. 7 and 8 illustrate certain implementations of memory dies having monolithic 3D memory configurations. It should be appreciated that FIGS. 7 and 8 are provided for illustration and that the examples of the disclosure are also applicable to other memory configurations, such as a 2D memory configuration or a non-monolithic 3D memory configuration (e.g., a stacked die 3D memory configuration).

FIG. 7 illustrates a portion of a memory die 700 having a NAND flash configuration. The memory die 700 may be included in the data storage device 302 of FIG. 3A. For example, the memory die 700 may correspond to the memory device 303 of FIG. 3A. The memory die 700 may be coupled to the controller 330 of FIG. 3A (e.g., via the connection 320).

The memory die 700 may include read/write circuitry 704 and one or more latches (e.g., a latch 705). For example, the read/write circuitry 704 may correspond to the read/write circuitry 310, and the latch 705 may be included within the circuitry 316.

The memory die 700 includes multiple physical layers, such as a group of physical layers 790. The multiple physical layers are monolithically formed above a substrate 794, such as a silicon substrate. Storage elements (e.g., memory cells), such as a representative memory cell 710, are arranged in arrays in the physical layers.

The representative memory cell 710 includes a charge trap structure 714 between a word line/control gate (WL4) 728 and a conductive channel 712. Charge may be injected into or drained from the charge trap structure 714 via biasing of the conductive channel 712 relative to the word line 728. For example, the charge trap structure 714 may include silicon nitride and may be separated from the word line 728 and the conductive channel 712 by a gate dielectric, such as silicon oxide. An amount of charge in the charge trap structure 714 affects an amount of current through the conductive channel 712 during a read operation of the memory cell 710 and indicates one or more bit values that are stored in the memory cell 710.

The memory die 700 includes multiple erase blocks, including a first block (block 0) 750, a second block (block 1) 752, and a third block (block 2) 754. Each block 750-754 includes a "vertical slice" of the physical layers 790 that includes a stack of word lines, illustrated as a first word line (WL0) 720, a second word line (WL1) 722, a third word line (WL2) 724, a fourth word line (WL3) 726, and a fifth word line (WL4) 728. Multiple conductive channels (having a substantially vertical orientation with respect to FIG. 7) extend through the stack of word lines. Each conductive channel is coupled to a storage element in each word line 720-728, forming a NAND string of storage elements. FIG. 7 illustrates three blocks 750-754, five word lines 720-728 in each block, and three conductive channels in each block for clarity of illustration. However, the memory die 700 may have more than three blocks, more than five word lines per block, and more than three conductive channels per block.

The read/write circuitry 704 is coupled to the conductive channels via multiple conductive lines, illustrated as a first bit line (BL0) 730, a second bit line (BL1) 732, and a third bit line (BL2) 734 at a "top" end of the conducive channels (e.g., farther from the substrate 794). The read/write circuitry 704 is also coupled to the conductive channels via multiple source lines, such as via a first source line (SL0) 740, a second source line (SL1) 742, and a third source line (SL2) 744 at a "bottom" end of the conductive channels (e.g., nearer to or within the substrate 794). The read/write circuitry 704 is illustrated as coupled to the bit lines 730-734 via "P" control lines, coupled to the source lines 740-744 via "M" control lines, and coupled to the word lines 720-728 via "N" control lines. Each of P, M, and N may have a positive integer value based on the specific configuration of the memory die 700. In the illustrative example of FIG. 7, P=3, M=3, and N=5.

In a particular example, each of the bit lines and each of the source lines may be coupled to the same end (e.g., the top end or the bottom end) of different conductive channels. For example, a particular bit line may be coupled to the top of a conductive channel 792 and a particular source line may be coupled to the top of the conductive channel 712. The bottom of the conductive channel 792 may be coupled (e.g., electrically coupled) to the bottom of the conductive channel 712. Accordingly, the conductive channel 792 and the conductive channel 712 may be coupled in series and may be coupled to the particular bit line and the particular source line.

In operation, the memory die 700 may perform write operations and read operations, such as in response to receiving commands from the controller 330. For a write operation, the controller 330 may receive a request for write access from the host device 370. The request may include data (e.g., the data 360) to be written at storage elements of the memory die 700. The controller 330 may send a command to the memory die 700 to cause the memory die 700 to initiate the write operation. For example, the controller 330 may send a write opcode and a physical address to the read/write circuitry 704 and data to the latch 705.

The read/write circuitry 704 may be configured to access the data in the latch 705 and to program the data to storage elements of the memory die 700 based on one or more write parameters indicated by the particular command. For example, the read/write circuitry 704 may be configured to apply selection signals to control lines coupled to the word lines 720-728, the bit lines 730-734, and the source lines 740-742 to cause a programming voltage (e.g., a voltage pulse or series of voltage pulses) to be applied across one or more selected storage elements of the selected word line (e.g., the word line 728, as an illustrative example).

For a read operation, the controller 330 may receive a request for read access from the host device 370. The controller 330 may cause the read/write circuitry 704 to read bits from particular storage elements of the memory die 700 by applying appropriate signals to the control lines to cause storage elements of a selected word line to be sensed. Accordingly, the memory die 700 may be configured to store and access data.

The memory die 700 is also configured to perform one or more operations associated with a second adjustment process in response to the host device 370 initiating a first adjustment process. For example, the controller 330 may send a command 711 to the memory die 700 in response to receiving the message 362. The command 711 may instruct the memory die 700 to sense values from storage elements of the memory die 700, to load values into the latch 705, or a combination thereof. In the example of FIG. 7, the command 711 may instruct the memory die 700 to initiate latch-based operations by sending and/or receiving data using the latch 705 without writing the data to storage elements of the memory die 700. To illustrate, the controller 330 may send the command 711 and a bit pattern 707 to the memory die 700 via the connection 320. The command 711 may instruct the memory die 700 to avoid writing the bit pattern 707 to the memory die 700. In another example, the memory die 700 stores the bit pattern 707 at a memory region of the memory die 700, such as at a read-only memory (ROM). In this example, the memory die 700 is configured to load the bit pattern 707 (e.g., from the ROM) to the latch 705 in response to receiving the command 711 from the controller 330 via the connection 320. In a particular example, the bit pattern 707 corresponds to the data 306, and the command 711 corresponds to the command 324.

FIG. 8 illustrates a portion of a memory die 800 having a ReRAM configuration. The memory die 800 may be included in the data storage device 302 of FIG. 3A. For example, the memory die 800 may correspond to the memory device 303 of FIG. 3A. The memory die 800 may be coupled to the controller 330 of FIG. 3A (e.g., via the connection 320).

The memory die 800 may include read/write circuitry 804. For example, the read/write circuitry 804 may correspond to the read/write circuitry 310 of FIG. 3A.

In the example of FIG. 8, the memory die 800 includes a vertical bit line (VBL) ReRAM with a plurality of conductive lines in physical layers over a substrate (e.g., substantially parallel to a surface of the substrate), such as representative word lines 820, 821, 822, and 823 (only a portion of which is shown in FIG. 8). The VBL ReRAM also includes a plurality of vertical conductive lines through the physical layers, such as representative bit lines 810, 811, 812, and 813. The word line 822 may include or correspond to a first group of physical layers, and the word lines 820, 821 may include or correspond to a second group of physical layers.

The memory die 800 also includes a plurality of resistance-based storage elements (e.g., memory cells), such as representative storage elements 830, 831, 832, 840, 841, and 842. Each of the storage elements 830, 831, 832, 840, 841, and 842 is coupled to (or is associated with) a bit line and a word line in arrays of memory cells in multiple physical layers over the substrate (e.g., a silicon substrate).

In the example of FIG. 8, each word line includes a plurality of fingers. To illustrate, the word line 820 includes fingers 824, 825, 826, and 827. Each finger may be coupled to more than one bit line. For example, the finger 824 of the word line 820 is coupled to the bit line 810 via the storage element 830 at a first end of the finger 824, and the finger 824 is further coupled to the bit line 811 via the storage element 840 at a second end of the finger 824.

In the example of FIG. 8, each bit line may be coupled to more than one word line. To illustrate, the bit line 810 is coupled to the word line 820 via the storage element 830, and the bit line 810 is further coupled to the word line 822 via the storage element 832.

In operation, the memory die 800 may perform write operations and read operations, such as in response to receiving commands from the controller 330 of FIG. 3A. For a write operation, the controller 330 of FIG. 3A may receive data (e.g., the data 360 of FIG. 3A) from a host device, such as the host device 370 of FIG. 3A. The controller 330 may send a command to the memory die 800 to cause the memory die 800 to initiate the write operation. The controller 330 may send data to the memory die 800 to be written to storage elements of the memory die 800.

The read/write circuitry 804 may be configured to program the data to storage elements corresponding to the destination of the data. For example, the read/write circuitry 804 may apply selection signals to selection control lines coupled to the word line drivers 808 and the bit line drivers 806 to cause a write voltage to be applied across a selected storage element. As an illustrative example, to select the storage element 830, the read/write circuitry 804 may activate the word line drivers 808 and the bit line drivers 806 to drive a programming current (also referred to as a write current) through the storage element 830. To illustrate, a first write current may be used to write a first logical value (e.g., a value corresponding to a high-resistance state) to the storage element 830, and a second write current may be used to write a second logical value (e.g., a value corresponding to a low-resistance state) to the storage element 830. The programming current may be applied by generating a programming voltage across the storage element 830 by applying a first voltage to the bit line 810 and to word lines other than the word line 820 and by applying a second voltage to the word line 820. In a particular example, the first voltage is applied to other bit lines (e.g., the bit lines 814, 815) to reduce leakage current in the memory die 800.

For a read operation, the controller 330 may receive a request from a host device, such as the host device 370 of FIG. 1. The controller 330 may issue a command to the memory die 800 specifying one or more physical addresses of the memory die 800.

The memory die 800 may cause the read/write circuitry 804 to read bits from particular storage elements of the memory die 800, such as by applying selection signals to selection control lines coupled to the word line drivers 808 and the bit line drivers 806 to cause a read voltage to be applied across a selected storage element. For example, to select the storage element 830, the read/write circuitry 804 may activate the word line drivers 808 and the bit line drivers 806 to apply a first voltage (e.g., 0.7 volts (V)) to the bit line 810 and to word lines other than the word line 820. A lower voltage (e.g., 0 V) may be applied to the word line 820. Thus, a read voltage is applied across the storage element 830, and a read current corresponding to the read voltage may be detected at a sense amplifier of the read/write circuitry 804. The read current corresponds (via Ohm's law) to a resistance state of the storage element 830, which corresponds to a logic value stored at the storage element 830. The logic value read from the storage element 830 and other elements read during the read operation may be provided to the controller 330 of FIG. 3A.

The memory die 800 is also configured to perform one or more operations associated with a second adjustment process in response to the host device 370 initiating a first adjustment process. For example, the controller 330 may send a command 890 to the memory die 800 in response to receiving the message 362. The command 890 may instruct the memory die 800 to sense values from storage elements of the memory die 800, to send values to the controller 330 using the connection 320, or a combination thereof. In the example of FIG. 8, the command 890 may instruct the memory die 800 to send and/or receive data without writing the data to storage elements of the memory die 800. To illustrate, the controller 330 may send the command 890 and a bit pattern 892 to the memory die 800 via the connection 320. The command 890 may instruct the memory die 800 to avoid writing the bit pattern 892 to the memory die 800. In another example, the memory die 800 stores the bit pattern 892 at a memory region of the memory die 800, such as at a read-only memory (ROM). In this example, the memory die 800 is configured to send the bit pattern 892 to the controller 330 in response to receiving the command 890 from the controller 330 via the connection 320. In a particular example, the bit pattern 892 corresponds to the data 306, and the command 890 corresponds to the command 324.

Figure 9:
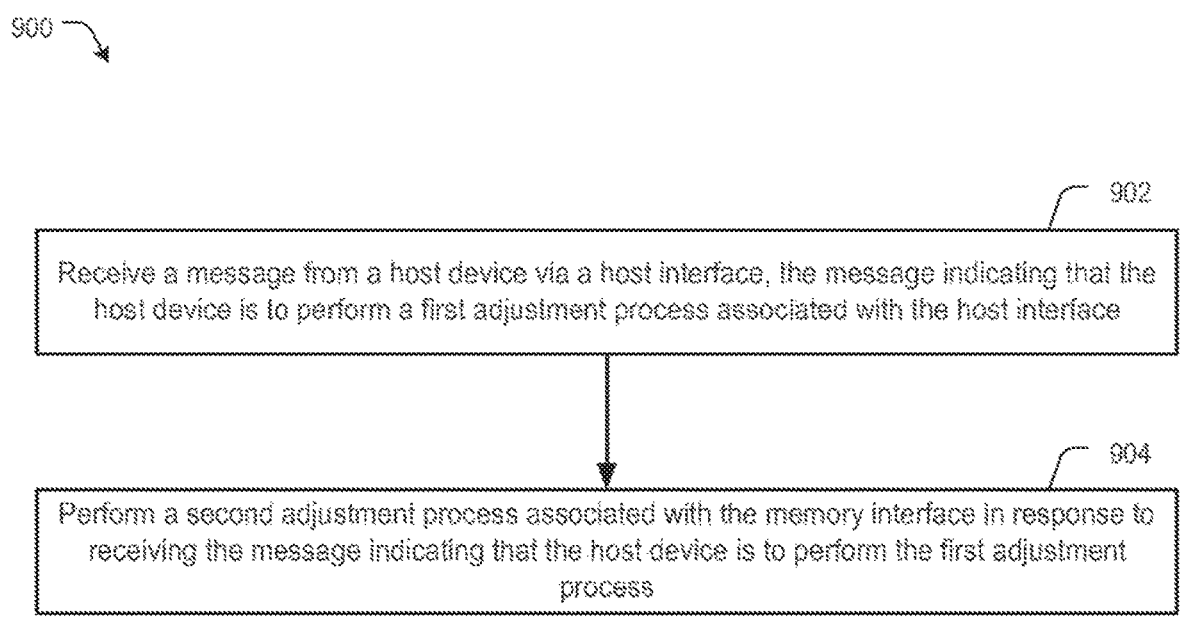
FIG. 9 is a flow diagram of an illustrative example of a method of operation of a data storage device.

Referring to FIG. 9, an illustrative example of a method is depicted and generally designated 900. The method 900 may be performed by a data storage device (e.g., the data storage device 302) that includes a memory die (e.g., a memory die included in the memory device 303, the memory die 700, or the memory die 800) and a controller (e.g., the controller 330). The controller includes a host interface (e.g., the host interface 120 or the first interface 338) and a memory interface (e.g., the memory interface 130 or the second interface 332).

The method 900 may include receiving a message from a host device via the host interface, at 902. The message indicates that the host device is to perform a first adjustment process associated with the host interface. To illustrate, the host device may correspond to the host device 370, and the message may correspond to the message 362.

The method 900 further includes performing a second adjustment process associated with the memory interface in response to receiving the message indicating that the host device is to perform the first adjustment process, at 904. For example, the second adjustment process may be performed by the data storage device during the first adjustment process performed by the host device.

To illustrate, the second adjustment process may include writing data (e.g., the data 306) to a memory (e.g., the memory 304) of the memory die in response to the message indicating that the host device is to initiate the first adjustment process. Alternatively or in addition, the second adjustment process may include reading the data from the memory in response to the message indicating that the host device is to initiate the first adjustment process, such as by reading the data 306 to generate the sensed data 328. Alternatively or in addition, the second adjustment process may include encoding the data at an ECC engine (e.g., the ECC engine 334) prior to sending the data to the memory and decoding the data at the ECC engine after reading the data from the memory. In implementations, the second adjustment process includes sending data to a latch (e.g., the latch 705) of the memory die and retrieving the data from the latch. Writing the data, reading the data, encoding the data, and/or sending the data to the latch in response to the host device 370 initiating the first adjustment process may increase an amount of noise at the memory interface as compared to performing the second adjustment process independently of the first adjustment process. Accordingly, the second adjustment process may result in a greater range of calibrated operating conditions (e.g., because the second adjustment process may be performed based on a range of "worst case" operating conditions instead of being based on an "optimistic" operating condition, which may fail to calibrate a memory interface for certain operating conditions).

In an illustrative implementation, the second adjustment process includes adjusting a phase of a timing signal (e.g., any of the timing signal 326, the clock or strobe signal 442, or the read enable signal 542) that is associated with the memory interface. The second adjustment process may include receiving data (e.g., the data 360, or other data) from the host device via the host interface, writing the data to a memory (e.g., the memory 304), and reading the data from the memory in response to the message indicating that the host device is to initiate the first adjustment process. In some cases, the host device may be "unaware" that the data is written to and read from the memory during the first adjustment process (e.g., writing and reading the data may be transparent to the host device during the first adjustment process). The host device may perform the first adjustment process to calibrate communications with the data storage device via the host interface (e.g., to adjust a phase delay of the timing signal 364).

In some examples, the message includes a command that complies with an embedded MultiMedia Card (eMMC) standard. In other implementations, the message includes a command that complies with one or more other standards, such as a Serial Advanced Technology Attachment (SATA) standard or a Universal Serial Bus (USB) standard, as illustrative examples.

Performing the second adjustment process in response to receiving the message may enable the first adjustment process to compensate for effects on the host interface that are due to operations at the memory interface. Further, performing the second adjustment process during the first adjustment process may also enable the second adjustment process to compensate for effects on the memory interface that are due to operations at the host interface. Thus, signal integrity of the interfaces may be improved.

In at least one implementation, a data storage device (e.g., the data storage device 302) includes a controller (e.g., the controller 330) and a memory device (e.g., the memory device 303). The controller includes a first interface (e.g., the host interface 120 or the first interface 338) configured to receive a message (e.g., the message 362) from a host device (e.g., the host device 370). The message indicates that the host device is to initiate a first calibration process associated with the first interface. The controller further includes a second interface (e.g., memory interface 130 or the second interface 332) coupled to the memory device. The controller also includes an interface timing adjustment engine (e.g., the interface timing adjustment engine 134) configured to initiate a second calibration process associated with the second interface in response to the message.

The controller may further include a timing device (e.g., the timing device 336). The interface timing adjustment engine may be further configured to adjust a phase of a timing signal (e.g., the timing signal 326) associated with the second interface using the timing device during the second calibration process. For example, the controller may be configured to generate a clock signal or a strobe signal (e.g., the clock or strobe signal 442), where the timing signal includes the clock signal or the strobe signal. As another example, the memory device may be configured to generate a read enable signal (e.g., the read enable signal 542), where the timing signal includes the read enable signal.

Although the interface timing adjustment engine 134 and certain other components described herein are illustrated as block components and described in general terms, such components may include one or more microprocessors, state machines, and/or other circuits configured to enable the data storage device 302 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 302 to perform one or more operations described herein.

Alternatively or in addition, one or more aspects of the data storage device 302 may be implemented using a microprocessor or microcontroller programmed (e.g., by executing instructions) to perform operations described herein, such as one or more operations of the method 900 of FIG. 9. In a particular example, the data storage device 302 includes a processor executing instructions (e.g., firmware) retrieved from the memory 304. Alternatively or in addition, instructions that are executed by the processor may be retrieved from a separate memory location that is not part of the memory 304, such as at a read-only memory (ROM).

It should be appreciated that one or more operations described herein as being performed by the controller 330 may be performed at the memory device 303. As an illustrative example, "in-memory" ECC operations may be performed at the memory device 303 alternatively or in addition to performing such operations at the controller 330.

The data storage device 302 may be coupled to, attached to, or embedded within one or more accessing devices, such as within a housing of the host device 370. For example, the data storage device 302 may be embedded within the host device 370 in accordance with a Joint Electron Devices Engineering Council (JEDEC) Solid State Technology Association Universal Flash Storage (UFS) configuration. To further illustrate, the data storage device 302 may be integrated within an electronic device (e.g., the host device 370), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 302 may be implemented in a portable device configured to be selectively coupled to one or more external devices, such as a host device. For example, the data storage device 302 may be removable from the host device 370 (i.e., "removably" coupled to the host device 370). As an example, the data storage device 302 may be removably coupled to the host device 370 in accordance with a removable universal serial bus (USB) configuration.

The host device 370 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 370 may communicate via a controller, which may enable the host device 370 to communicate with the data storage device 302. The host device 370 may operate in compliance with a JEDEC Solid State Technology Association industry specification, such as an embedded MultiMedia Card (eMMC) specification or a Universal Flash Storage (UFS) Host Controller Interface specification. The host device 370 may operate in compliance with one or more other specifications, such as a Secure Digital (SD) Host Controller specification as an illustrative example. Alternatively, the host device 370 may communicate with the data storage device 302 in accordance with another communication protocol. In some implementations, the system 300, the data storage device 302, or the memory 304 may be integrated within a network-accessible data storage system, such as an enterprise data system, an NAS system, or a cloud data storage system, as illustrative examples.

In some implementations, the data storage device 302 may include a solid state drive (SSD). The data storage device 302 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 302 may be coupled to the host device 370 via a network. For example, the network may include a data center storage system network, an enterprise storage system network, a storage area network, a cloud storage network, a local area network (LAN), a wide area network (WAN), the Internet, and/or another network.

To further illustrate, the data storage device 302 may be configured to be coupled to the host device 370 as embedded memory, such as in connection with an embedded MultiMedia Card (eMMC®) (trademark of JEDEC Solid State Technology Association, Arlington, Va.) configuration, as an illustrative example. The data storage device 302 may correspond to an eMMC device. As another example, the data storage device 302 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 302 may operate in compliance with a JEDEC industry specification. For example, the data storage device 302 may operate in compliance with a JEDEC eMMC specification, a JEDEC Universal Flash Storage (UFS) specification, one or more other specifications, or a combination thereof.

The memory 304 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory 304 may include another type of memory. In a particular example, the data storage device 302 is indirectly coupled to an accessing device (e.g., the host device 370) via a network. For example, the data storage device 302 may be a network-attached storage (NAS) device or a component (e.g., a solid-state drive (SSD) component) of a data center storage system, an enterprise storage system, or a storage area network. The memory 304 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
a comparator, wherein the comparator is configured to detect a message indicating that a host device is to initiate a first calibration process associated with a first interface; and
a phase calibrator, wherein the phase calibrator is configured to initiate a second calibration process associated with a second interface in response to the message indicating that the host device is to initiate the first calibration process.

2. The data storage device of claim 1, further comprising a timing device, wherein the phase calibrator is further configured to adjust a phase of a timing signal associated with the second interface using the timing device during the second calibration process.

3. The data storage device of claim 2, further comprising a controller that includes the comparator and the phase calibrator, wherein the controller is further configured to generate a clock signal or a strobe signal, and wherein the timing signal includes the clock signal or the strobe signal.

4. The data storage device of claim 2, further comprising a memory device, wherein the memory device is configured to generate a read enable signal, and wherein the timing signal includes the read enable signal.

5. The data storage device of claim 4, wherein the memory device includes a non-volatile memory having a three-dimensional (3D) memory configuration that is monolithically formed in one or more physical levels of arrays of memory cells having an active area above a silicon substrate, and further comprising circuitry associated with operation of the memory cells.

6. A data storage device comprising:
a memory device; and
a controller coupled to the memory device, the controller including a host interface and a memory interface, the controller configured to receive a message from a host device via the host interface, the message indicating that the host device is to perform a first adjustment process associated with the host interface, the controller further configured to perform a second adjustment process associated with the memory interface in response to receiving the message indicating that the host device is to perform the first adjustment process, wherein the host device performs the first adjustment process to calibrate a phase of a first timing signal associated with the host interface and the controller performs the second adjustment process to calibrate a phase of a second timing signal associated with the memory interface, and
wherein the second adjustment process affects the first adjustment process.

7. The data storage device of claim 6, further comprising:
a comparator configured to detect the message, wherein the first adjustment process comprises a first calibration process associated with the host interface; and
a phase calibrator configured to initiate the second adjustment process in response to the message indicating that the host device is to initiate the first adjustment process, wherein the second adjustment process comprises a second calibration process associated with the memory interface.

8. The data storage device of claim 6, further comprising a timing device, wherein the controller is further configured to adjust a phase of a timing signal associated with the memory interface using the timing device during the second adjustment process.

9. The data storage device of claim 8, wherein the controller is further configured to generate a clock signal or a strobe signal, and
the timing signal includes the clock signal or the strobe signal.

10. The data storage device of claim 8, wherein:
the memory device is configured to generate a read enable signal, and
the timing signal includes the read enable signal.

11. The data storage device of claim 6, wherein the memory device includes a non-volatile memory having a three-dimensional (3D) memory configuration that is monolithically formed in one or more physical levels of arrays of memory cells having an active area above a silicon substrate, and further comprising circuitry associated with operation of the memory cells.

12. An apparatus comprising:
means for receiving a message from a host device, the message indicating that the host device is to perform a first adjustment process associated with the means for receiving; and
means for performing a second adjustment process in response to receiving the message indicating that the host device is to perform the first adjustment process, wherein the host device performs the first adjustment process to calibrate a phase of a first timing signal associated with a host interface and a controller performs the second adjustment process to calibrate a phase of a second timing signal associated with a memory interface, and
wherein the second adjustment process affects the first adjustment process.

13. The apparatus of claim 12, further comprising:
means for storing data, wherein the second adjustment process includes reading the data in response to the message indicating that the host device is to perform the first adjustment process; and
means for decoding the data after the data is read from the means for storing.

* * * * *